(12) United States Patent
Shima et al.

(10) Patent No.: US 7,144,675 B2
(45) Date of Patent: Dec. 5, 2006

(54) RADIATION-SENSITIVE RESIN COMPOSITION

(75) Inventors: Motoyuki Shima, Tokyo (JP); Hiroyuki Ishii, Tokyo (JP); Masafumi Yamamoto, Tokyo (JP); Daichi Matsuda, Tokyo (JP); Atsushi Nakamura, Tokyo (JP)

(73) Assignee: JSR Corporation, Tokyo (JP)

( * ) Notice: Subject to any disclaimer, the term of this patent is extended or adjusted under 35 U.S.C. 154(b) by 11 days.

(21) Appl. No.: 10/648,243

(22) Filed: Aug. 27, 2003

(65) Prior Publication Data

US 2004/0048192 A1  Mar. 11, 2004

(30) Foreign Application Priority Data

Aug. 29, 2002 (JP) ............... 2002-251812
Apr. 17, 2003 (JP) ............... 2003-112902

(51) Int. Cl.
 G03F 7/004 (2006.01)
(52) U.S. Cl. .................... 430/270.1; 430/921
(58) Field of Classification Search ............ 430/270.1, 430/910, 921
See application file for complete search history.

(56) References Cited

U.S. PATENT DOCUMENTS

| | | | |
|---|---|---|---|
| 5,215,857 A | 6/1993 | Hosaka et al. | |
| 5,238,774 A | 8/1993 | Hosaka et al. | |
| 5,405,720 A | 4/1995 | Hosaka et al. | |
| 5,494,784 A | 2/1996 | Hosaka et al. | |
| 5,925,492 A | 7/1999 | Hosaka et al. | |
| 6,020,104 A | 2/2000 | Hosaka et al. | |
| RE37,179 E | 5/2001 | Yamachika et al. | |
| 6,228,554 B1 | 5/2001 | Hosaka et al. | |
| 6,270,939 B1 | 8/2001 | Hosaka et al. | |
| 6,280,900 B1 | 8/2001 | Chiba et al. | |
| 6,337,171 B1 | 1/2002 | Kobayashi et al. | |
| 6,403,280 B1 | 6/2002 | Yamahara et al. | |
| 6,468,714 B1 | 10/2002 | Kai et al. | |
| 6,482,568 B1 | 11/2002 | Douki et al. | |
| 6,506,537 B1 | 1/2003 | Kobayashi et al. | |
| 6,517,992 B1 | 2/2003 | Wang et al. | |
| 6,517,993 B1 * | 2/2003 | Nakamura et al. | 430/270.1 |
| 6,531,260 B1 | 3/2003 | Iwasawa et al. | |
| 6,623,907 B1 | 9/2003 | Numata et al. | |
| 6,692,887 B1 | 2/2004 | Suwa et al. | |
| 6,692,897 B1 * | 2/2004 | Fujimori et al. | 430/270.1 |
| 6,806,026 B1 * | 10/2004 | Allen et al. | 430/270.1 |
| 6,824,956 B1 * | 11/2004 | Sato | 430/270.1 |
| 6,830,866 B1 * | 12/2004 | Kobayashi et al. | 430/270.1 |
| 6,962,766 B1 * | 11/2005 | Uenishi et al. | 430/270.1 |
| 2002/0009667 A1 | 1/2002 | Nishimura et al. | |
| 2002/0009668 A1 | 1/2002 | Nishimura et al. | |
| 2002/0058201 A1 | 5/2002 | Miyaji et al. | |
| 2002/0090569 A1 | 7/2002 | Suzuki et al. | |
| 2002/0132181 A1 | 9/2002 | Nishimura et al. | |
| 2002/0172885 A1 | 11/2002 | Nagai et al. | |
| 2002/0192593 A1 | 12/2002 | Nagai et al. | |
| 2003/0022095 A1 | 1/2003 | Kai et al. | |
| 2003/0113658 A1 | 6/2003 | Ebata et al. | |
| 2003/0113660 A1 | 6/2003 | Yoneda et al. | |
| 2003/0157423 A1 | 8/2003 | Nagai et al. | |
| 2003/0170561 A1 | 9/2003 | Iwasawa et al. | |
| 2003/0191268 A1 | 10/2003 | Iwasawa et al. | |
| 2003/0194634 A1 | 10/2003 | Nagai et al. | |
| 2003/0203307 A1 | 10/2003 | Soyano et al. | |
| 2003/0203309 A1 | 10/2003 | Nishimura et al. | |
| 2003/0219680 A1 | 11/2003 | Nishimura et al. | |
| 2004/0072094 A1 | 4/2004 | Shima et al. | |

FOREIGN PATENT DOCUMENTS

| | | |
|---|---|---|
| JP | 02-027660 A | 1/1990 |
| JP | 04-226461 | 8/1992 |
| JP | 07-234511 A | 9/1995 |

* cited by examiner

*Primary Examiner*—Rosemary Ashton
(74) *Attorney, Agent, or Firm*—Merchant & Gould, P.C.; Steven B. Kelber

(57) ABSTRACT

A radiation-sensitive resin composition comprising (A) a resin comprising at least two recurring units of the formulas (1)–(6) in the total amount of 5–70 mol %, but each in the amount of 1–49 mol %, the resin being insoluble or scarcely soluble in alkali, but becoming easily soluble in alkali by the action of an acid, and (B) a photoacid generator.

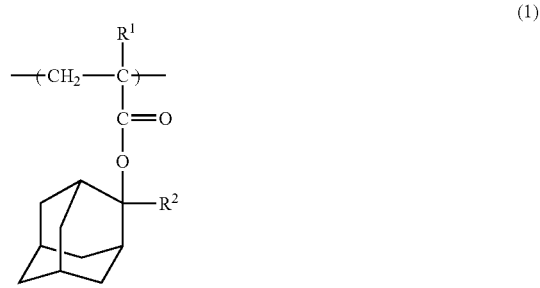

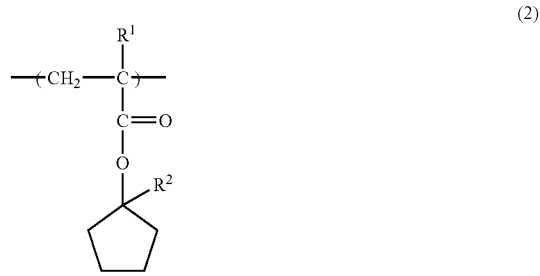

-continued
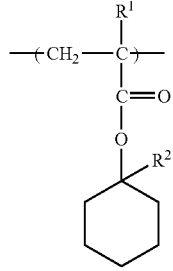
(3)
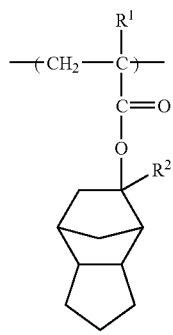
(4)
-continued
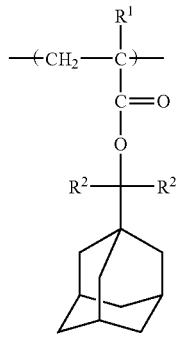
(5)
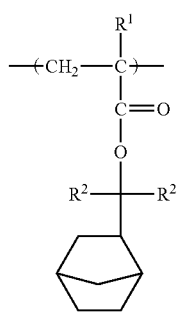
(6)
wherein $R^1$ is a hydrogen or methyl and $R^2$ is a substituted or unsubstituted alkyl group having 1–4 carbon atoms. The resin composition is useful as a chemically amplified resist having high transmittance of radiation, sensitivity, resolution, dry etching resistance, and pattern profile.
12 Claims, No Drawings

RADIATION-SENSITIVE RESIN COMPOSITION

BACKGROUND OF THE INVENTION

1. Field of the Invention

The present invention relates to a radiation-sensitive resin composition suitable as a chemically-amplified resist useful for microfabrication utilizing various types of radiation represented by deep ultraviolet rays such as a KrF excimer laser and ArF excimer laser, X-rays such as synchrotron radiation, and charged particle rays such as electron beams.

2. Description of Background Art

In the field of microfabrication represented by the manufacture of integrated circuit devices, lithographic technology enabling microfabrication with a line width of 0.20 µm or less has been demanded in order to increase the degree of integration in recent years.

In a conventional lithographic process, near ultraviolet rays such as i-line radiation have been generally used. However, it is difficult to perform microfabrication with a line width of sub-quarter micron using near ultraviolet rays.

Therefore, in order to enable microfabrication with a line width of 0.20 µm or less, utilization of radiation with a shorter wavelength has been studied. Deep ultraviolet rays represented by a bright line spectrum of a mercury lamp and an excimer laser, X-rays, electron beams, and the like can be given as radiation with a shorter wavelength. Of these, a KrF excimer laser (wavelength: 248 nm) and an ArF excimer laser (wavelength: 193 nm) have attracted attention.

As a resist applicable to the excimer laser radiation, a number of resists utilizing a chemical amplification effect between a component having an acid-dissociable functional group and a component generating an acid (hereinafter referred to as "photoacid generator") which generates an acid upon irradiation (hereinafter referred to as "exposure") has been proposed. Such a resist is hereinafter called a chemically-amplified resist.

As such a chemically-amplified resist, Japanese Patent Publication No. 2-27660 discloses a resist comprising a polymer containing a t-butyl ester group of carboxylic acid or a t-butylcarbonate group of phenol and a photoacid generator. The t-butoxycarbonyl group or t-butylcarbonate group in the polymer dissociates by the action of an acid generated upon exposure, whereby the polymer has an acidic group such as a carboxylic group or a phenolic hydroxyl group. As a result, exposed areas of the resist film become readily soluble in an alkaline developer.

Most of conventional chemically-amplified resists use a phenol resin as a base resin. Deep ultraviolet rays, if used for such a resin as radiation for exposure, are absorbed in the resin due to aromatic rings in the resin and cannot sufficiently reach the lower layers of the resist film. Because of this, the dose of the radiation is greater in the upper layers and smaller in the lower layers of the resist film. This causes a resist pattern profile to be thinner in the upper portion but thicker toward the lower portion, thereby forming a trapezoid shape after development. No sufficient resolution can be obtained from such a resist film. Such a trapezoid resist pattern profile formed after development cannot give a desirable dimensional accuracy in the succeeding steps such as an etching step and an ion implantation step. In addition, if the resist pattern profile is not a rectangle in which the upper side and the sidewall make almost right angle, the resist disappears faster during dry etching, making it difficult to control etching conditions.

A resist pattern profile can be improved by increasing the radiation transmittance through the resist film. For example, a (meth)acrylate resin represented by polymethylmethacrylate is a highly desirable resin from the viewpoint of radiation transmittance, because the (meth)acrylate resin has high transparency to deep ultraviolet rays. Japanese Patent Application Laid-open No. 4-226461 discloses a chemically-amplified resist using a methacrylate resin, for example.

However, this composition has insufficient dry etching resistance due to the absence of an aromatic ring, although the composition excels in microfabrication performance. This makes it difficult to perform etching with high accuracy. Therefore, a composition having both transparency to radiation and dry etching resistance cannot be provided.

As a means to improve dry etching resistance of the chemically-amplified resist without impairing transparency to radiation, a method of introducing an aliphatic ring into the resin component in the resist instead of an aromatic ring is known. For example, Japanese Patent Application Laid-open No. 7-234511 discloses a chemically-amplified resist using a (meth)acrylate resin having an aliphatic ring.

This resist includes groups which comparatively easily dissociate by conventional acids (acetal functional groups such as tetrahydropyranyl group, for example) and groups which are comparatively difficult to dissociate by acids (t-butyl functional groups such as t-butyl ester group or t-butylcarbonate group, for example) as acid-dissociable functional groups in the resin component. The resin component having the former acid-dissociable functional groups exhibits excellent basic characteristics as a resist, in particular, superior sensitivity and excellent pattern profile, but has poor storage stability as the composition. The resin component having the latter acid-dissociable functional groups has excellent storage stability, but exhibits impaired resist characteristics such as sensitivity and pattern shape. Moreover, inclusion of aliphatic rings in the resin component of this resist results in poor adhesion to substrates due to the extreme increase in hydrophobicity of the resin.

When forming a resist pattern by using a chemically-amplified resist, a heat treatment is usually performed after exposure in order to promote the dissociation of the acid-dissociable functional group. The line width of the resist pattern is inevitably changed to some extent as the heating temperature is changed. However, in order to deal with a recent decrease in size of integrated circuit devices, development of a resist which shows only a small change in line width due to a change in heating temperature after exposure (specifically, temperature dependency) has been demanded.

In addition, the photoacid generator is known to greatly affect the functions of a chemically-amplified resist. Presently, onium salt compounds which generate an acid upon exposure at a high quantum yield and exhibit high sensitivity are widely used as a photoacid generator for chemically-amplified resists.

As the onium salt compounds, triphenylsulfonium hexafluoroantimonate, triphenylsulfonium naphthalenesulfonate, and cyclohexylmethyl(2-oxocyclohexyl)sulfonium trifluoromethanesulfonate are used, for example. Most of these conventional onium salt compounds, however, do not exhibit satisfactory sensitivity. Although some compounds may exhibit comparatively high sensitivity, they are not necessarily satisfactory in overall resist performance such as resolution, pattern profile, and the like.

In view of development of technology capable of dealing with a recent progress in microfabrication of integrated circuit devices, a chemically-amplified resist which is applicable to short wavelength radiation represented by deep ultraviolet rays, exhibits high radiation transmittance, and excels in basic characteristics as a resist such as sensitivity, resolution, and pattern profile has been strongly demanded.

SUMMARY OF THE INVENTION

An object of the present invention is to provide a radiation-sensitive resin composition useful as a chemically amplified resist having high transmittance of radiation and exhibiting superior basic properties as a resist such as high sensitivity, resolution, dry etching resistance, and pattern profile.

The above object can be achieved in the present invention by radiation-sensitive resin composition comprising:

(A) a resin comprising at least two recurring units of the following formulas (1)–(6),

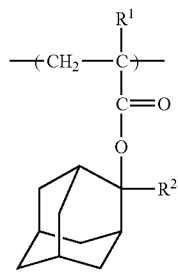
(1)

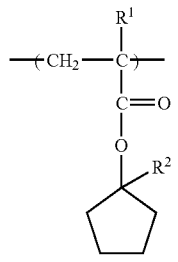
(2)

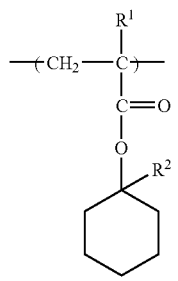
(3)

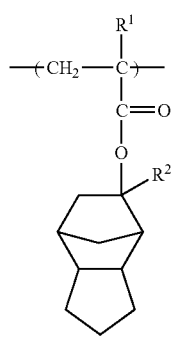
(4)

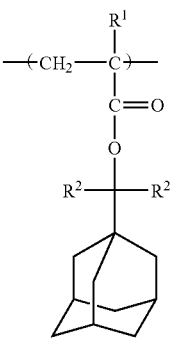
(5)

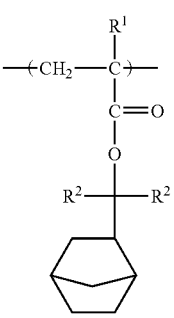
(6)

wherein $R^1$ represents a hydrogen atom or methyl group and $R^2$ represents a substituted or unsubstituted alkyl group having 1–4 carbon atoms, two or more $R^2$ groups that may be present being either the same or different, in the total amount of 5–70 mol %, but each in the amount of 1–49 mol %, the resin being insoluble or scarcely soluble in alkali, but becoming easily soluble in alkali by the action of an acid, and (B) a photoacid generator.

In a preferred embodiment of the above radiation-sensitive resin composition, the photoacid generator (B) is a compound of the following formula (7),

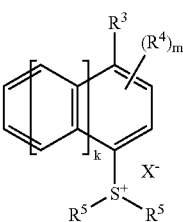
(7)

wherein $R^3$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, $R^4$ represents a linear or branched alkyl group having 1–10 carbon atoms, $R^5$ individually represents a linear or branched alkyl group having 1–10 carbon atoms, substituted or unsubstituted phenyl group, or substituted or unsubstituted naphthyl group, or two $R^5$ groups bond to form a substituted or unsubstituted divalent group having 2–10 carbon atoms, k is an integer of 0 to 2, $X^-$ represents an anion represented by the formula $R^6C_nF_{2n}SO_3^-$ (wherein $R^6$ represents a fluorine atom or substituted or unsubstituted monovalent hydrocarbon group and n is an integer of 1 to 10), and m is an integer of 0 to 10.

In another preferred embodiment of the above radiation-sensitive resin composition, the resin (A) and the photoacid generator (B) are dissolved in a solvent comprising at least one compound selected from the group consisting of propylene glycol mono-methyl ether acetate, 2-heptanone, and cyclohexanone.

In the above radiation-sensitive resin composition, the resin (A) preferably comprises at least two recurring units selected from the group consisting of the recurring units of the formulas (1)–(3).

In the above radiation-sensitive resin composition, the resin (A) preferably comprises at least one recurring units selected from the group consisting of the recurring units of the formulas (1)–(3) wherein $R^2$ is a methyl group and at least one recurring units selected from the group consisting of the recurring units of the formulas (1)–(3) wherein $R^2$ is other than the methyl group.

In the above radiation-sensitive resin composition, the resin (A) preferably comprises at least one recurring unit of the formula (6) wherein $R^2$ is a methyl group and at least one recurring unit selected from the group consisting of the recurring units of the formulas (1)–(3).

DETAILED DESCRIPTION OF THE INVENTION AND PREFERRED EMBODIMENTS

The present invention will be described in detail below.

Component (A)

The component (A) in the present invention is a resin comprising at least two recurring units selected from the groups of the above formulas (1)–(6), in the total amount of 5–70 mol %, but each group in the amount of 1–49 mol %. The resin is insoluble or scarcely soluble in alkali, but becomes easily soluble in alkali by the action of an acid. This resin is hereinafter referred to as "resin (A)".

If 50% or more of the initial film thickness of a resist film remains after development when a resist film made only from the resin (A) is developed under the same alkaline development conditions (in an aqueous alkaline solution concentration of pH 8–14, and more preferably pH 9–14) employed for forming a resist pattern using a resist film formed from a radiation-sensitive resin composition comprising the resin (A), such a characteristic of the resin (A) is referred to as "insoluble or scarcely soluble in alkali" in the present invention. The term "easily soluble in alkali" means the characteristics in which 50% or more of the initial film thickness of a resist film is lost.

The recurring units of the formulas (1), (2), (3), (4), (5), and (6) are hereinafter respectively referred to as a recurring unit (1), recurring unit (2), recurring unit (3), recurring unit (4), recurring unit (5), and recurring unit (6).

The recurring units (1)–(6) are units respectively derived from the monomers of the following formulas (1m) to (6m), (1m)

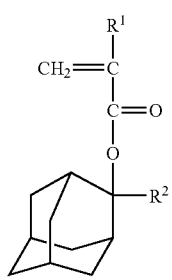

-continued (2m)

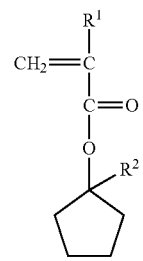

(3m)

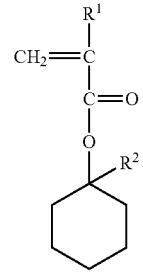

(4m)

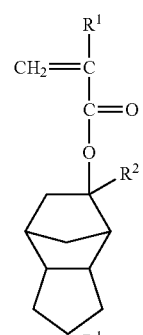

(5m)

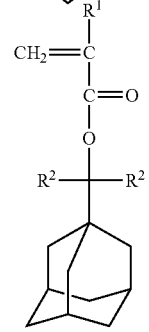

(6m)

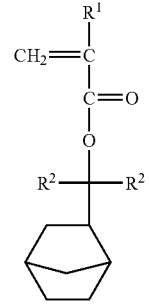

wherein $R^1$ and $R^2$ are the same as defined for the formulas (1)–(6).

These monomers may be used either individually or in combination of two or more.

The resin (A) can comprise recurring units other than the recurring units (1)–(6) (hereinafter referred to as "other recurring units").

Examples of the polymerizable unsaturated monomer to provide the other recurring units include: monofunctional monomers such as (meth)acrylates having a bridged hydrocarbon skeleton such as norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, 3-hydroxy-1-adamantyl (meth)acrylate, 3,5-dihydroxy-1-adamantyl (meth)acrylate, 3-oxo-1-adamantyl (meth)acrylate, and adamantylmethyl (meth)acrylate; carboxyl group-containing esters having a bridged hydrocarbon skeleton of an unsaturated carboxylic acid such as carboxynorbornyl (meth)acrylate, carboxytricyclodecanyl (meth)acrylate, and carboxytetracyclodecanyl (meth)acrylate; (meth)acrylates having no bridged hydrocarbon skeleton such as methyl (meth)acrylate, ethyl (meth)acrylate, n-propyl (meth)acrylate, n-butyl (meth)acrylate, 2-methylpropyl (meth)acrylate, 1-methylpropyl (meth)acrylate, t-butyl (meth)acrylate, 2-hydroxyethyl (meth)acrylate, 2-hydroxypropyl (meth)acrylate, 3-hydroxypropyl (meth)acrylate, cyclopropyl (meth)acrylate, cyclopentyl (meth)acrylate, cyclohexyl (meth)acrylate, 4-methoxycyclohexyl (meth)acrylate, 2-cyclopentyloxycarbonylethyl (meth)acrylate, 2-cyclohexyloxycarbonylethyl (meth)acrylate, and 2-(4-methoxycyclohexyl)oxycarbonylethyl (meth)acrylate; α-hydroxymethylacrylates such as methyl α-hydroxymethylacrylate, ethyl α-hydroxymethylacrylate, n-propyl α-hydroxymethylacrylate, and n-butyl α-hydroxymethylacrylate; unsaturated nitrile compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl (meth)acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine, and vinylimidazole; unsaturated carboxylic acids (anhydrides) such as a (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acid having no bridged hydrocarbon skeleton such as 2-carboxyethyl (meth)acrylate, 2-carboxypropyl (meth)acrylate, 3-carboxypropyl (meth)acrylate, 4-carboxybutyl (meth)acrylate, and 4-carboxycyclohexyl (meth)acrylate; and (meth)acryloyloxylactone compounds having an acid-dissociable group such as α-(meth)acryloyloxy-β-methoxycarbonyl-γ-butyrolactone,
α-(meth)acryloyloxy-β-ethoxycarbonyl-γ-butyrolactone,
α-(meth)acryloyloxy-β-n-propoxycarbonyl-γ-butyrolactone,
α-(meth)acryloyloxy-β-i-propoxycarbonyl-γ-butyrolactone,
α-(meth)acryloyloxy-β-n-butoxycarbonyl-γ-butyrolactone,
α-(meth)acryloyloxy-β-(2-methylpropoxy)carbonyl-γ-butyrolactone,
α-(meth)acryloyloxy-β-(1-methylpropoxy)carbonyl-γ-butyrolactone,
α-(meth)acryloyloxy-β-t-butoxycarbonyl-γ-butyrolactone,
α-(meth)acryloyloxy-β-cyclohexyloxycarbonyl-γ-butyrolactone,
α-(meth)acryloyloxy-β-(4-t-butylcyclohexyloxy) carbonyl-γ-butyrolactone,
α-(meth)acryloyloxy-β-phenoxycarbonyl-γ-butyrolactone,
α-(meth)acryloyloxy-β-(1-ethoxyethoxy)carbonyl-γ-butyrolactone,
α-(meth)acryloyloxy-β-(1-cyclohexyloxyethoxy)carbonyl-γ-butyrolactone,
α-(meth)acryloyloxy-β-t-butoxycarbonylmethoxycarbonyl-γ-butyrolactone,
α-(meth)acryloyloxy-β-tetrahydrofuranyloxycarbonyl-γ-butyrolactone,
α-(meth)acryloyloxy-β-tetrahydropyranyloxycarbonyl-γ-butyrolactone,
α-methoxycarbonyl-β-(meth)acryloyloxy-γ-butyrolactone,
α-ethoxycarbonyl-β-(meth)acryloyloxy-γ-butyrolactone,
α-n-propoxycarbonyl-β-(meth)acrylyloxy-γ-butyrolactone,
α-i-propoxycarbonyl-β-(meth)acryloyloxy-γ-butyrolactone,
α-n-butoxycarbonyl-β-(meth)acryloyloxy-γ-butyrolactone,
α-(2-methylpropoxy)carbonyl-β-(meth)acryloyloxy-γ-butyrolactone,
α-(1-methylpropoxy)carbonyl-β-(meth)acryloyloxy-γ-butyrolactone,
α-t-butoxycarbonyl-β-(meth)acryloyloxy-γ-butyrolactone,
α-cyclohexyloxycarbonyl-β-(meth)acryloyloxy-γ-butyrolactone,
α-(4-t-butylcyclohexyloxy)carbonyl-β-(meth)acryloyloxy-γ-butyrolactone,
α-phenoxycarbonyl-β-(meth)acryloyloxy-γ-butyrolactone,
α-(1-ethoxyethoxy)carbonyl-β-(meth)acryloyloxy-γ-butyrolactone,
α-(1-cyclohexyloxyethoxy)carbonyl-β-(meth)acryloyloxy-γ-butyrolactone,
α-t-butoxycarbonylmethoxycarbonyl-β-(meth)acryloyloxy-γ-butyrolactone,
α-tetrahydrofuranyloxycarbonyl-β-(meth)acryloyloxy-γ-butyrolactone,
α-tetrahydropyranyloxycarbonyl-β-(meth)acryloyloxy-γ-butyrolactone, and
β-(meth)acryloyloxy-β-methyl-δ-valerolactone; and (meth)acryloyloxylactone compounds having no acid-dissociable group such as α-(meth)acryloyloxy-γ-butyrolactone,
β-(meth)acryloyloxy-γ-butyrolactone,
α-(meth)acryloyloxy-β-fluoro-γ-butyrolactone,
α-(meth)acryloyloxy-β-hydroxy-γ-butyrolactone,
α-(meth)acryloyloxy-β-methyl-γ-butyrolactone,
α-(meth)acryloyloxy-β-ethyl-γ-butyrolactone,
α-(meth)acryloyloxy-β,β-dimethyl-γ-butyrolactone,
α-(meth)acryloyloxy-β-methoxy-γ-butyrolactone,
α-fluoro-β-(meth)acryloyloxy-γ-butyrolactone,
α-hydroxy-β-(meth)acryloyloxy-γ-butyrolactone,
α-methyl-β-(meth)acryloyloxy-γ-butyrolactone,
α-ethyl-β-(meth)acryloyloxy-γ-butyrolactone,
α,α-dimethyl-β-(meth)acryloyloxy-γ-butyrolactone,
α-methoxy-β-(meth)acryloyloxy-γ-butyrolactone,
α-(meth)acryloyloxy-δ-valerolactone,
β-(meth)acryloyloxy-δ-valerolactone,
δ-(meth)acryloyloxy-γ-valerolactone,
δ-(meth)acryloyloxy-β-methyl-γ-valerolactone, δ-(meth)acryloyloxy-β,β-dimethyl-γ-valerolactone,
2-(meth)acryloyloxy-5-oxo-4-oxatricyclo[4.2.1.0$^{3,7}$]nonane,
2-(meth)acryloyloxy-9-methoxycarbonyl-5-oxo-4-oxatricyclo[4.2.1.$^{3,7}$]nonane,
4-(meth)acryloyloxy-7-oxo-6-oxabicyclo[3.2.1]octane,
4-(meth)acryloyloxy-2-methoxycarbonyl-7-oxo-6-oxabicyclo[3.2.1]octane, and
8(9)-(meth)acryloyloxy-3-oxo-4-oxatricyclo[5.2.1.0$^{2,6}$]decane, and polyfunctional monomers such as polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate; and polyfunctional monomers having no bridged hydrocarbon skeleton such as methylene glycol di(meth)acrylate, ethylene glycol di(meth)acrylate, propylene glycol di(meth)acrylate, 1,6-hexanediol di-(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, and 1,3-bis(2-hydroxypropyl)benzene di(meth)acrylate.

Of these polymerizable unsaturated monomers providing the other recurring units, (meth)acrylates having a bridged hydrocarbon skeleton and the like are preferable.

Examples of the more preferable polymerizable unsaturated monomer include 3-hydroxy-1-adamantanyl (meth)acrylate,
3,5-dihydroxy-1-adamantanyl (meth)acrylate,
3-oxo-1-adamantanyl (meth)acrylate,
2-(meth)acryloyloxy-5-oxo-4-oxatricyclo[4.2.1.0$^{3,7}$]nonane,
2-(meth)acryloyloxy-9-methoxycarbonyl-5-oxo-4-oxatricyclo[4.2.1.0$^{3,7}$]nonane,
4-(meth)acryloyloxy-7-oxo-6-oxabicyclo[3.2.1]octane,
4-(meth)acryloyloxy-2-methoxycarbonyl-7-oxo-6-oxabicyclo[3.2.1]octane, and
8(9)-(meth)acryloyloxy-3-oxo-4-oxatricyclo[5.2.1.0$^{2,6}$]decane.

In the resin (A), these other recurring units may be present either individually or in combination of two or more.

In the resin (A), the amount of each recurring unit of the at least two recurring units selected from the recurring units (1)–(6) is preferably 1–49 mol %, and preferably 3–40 mol % of the total amount of all recurring units forming the resin. The total of the recurring units (1)–(6) of the total amount of all recurring units forming the resin is preferably 5–70 mol %. If the amount of the recurring units (1)–(6) is less than 5 mol %, not only a sufficient contrast cannot be obtained during development, but also resolution becomes poor, giving rise to development defects. If the amount exceeds 70 mol %, on the other hand, developability and sensitivity are significantly impaired, although contrast to developing solutions is improved.

The content of the other recurring units is usually 95 mol % or less, and preferably 80 mol % or less.

As preferable combinations of recurring units selected from the recurring units (1)–(6), a combination of the recurring unit (1) ($R^1$: —$CH_3$, $R^2$: —$CH_3$) and the recurring unit (1) ($R^1$: —$CH_3$, $R^2$: —$C_2H_5$), a combination of the recurring unit (1) ($R^1$: —$CH_3$, $R^2$: —$CH_3$) and the recurring unit (2) ($R^1$: —$CH_3$, $R^2$: —$CH_3$), a combination of the recurring unit (1) ($R^1$: —$CH_3$, $R^2$: —$CH_3$) and the recurring unit (2) ($R^1$: —$CH_3$, $R^2$: —$C_2H_5$), a combination of the recurring unit (1) ($R^1$: —$CH_3$, $R^2$: —$CH_3$) and the recurring unit (2) ($R^1$: —$CH_3$, $R^2$: —$C_4H_9$), a combination of the recurring unit (1) ($R^1$: —$CH_3$, $R^2$: —$CH_3$) and the recurring unit (3) ($R^1$: —$CH_3$, $R^2$: —$CH_3$), a combination of the recurring unit (1) ($R^1$: —$CH_3$, $R^2$: —$CH_3$) and the recurring unit (3) ($R^1$: —$CH_3$, $R^2$: —$C_2H_5$), a combination of the recurring unit (1) ($R^1$: —$CH_3$, $R^2$: —$CH_3$) and the recurring unit (4) ($R^1$: —$CH_3$, $R^2$: —$CH_3$), a combination of the recurring unit (1) ($R^1$: —$CH_3$, $R^2$: —$CH_3$) and the recurring unit (4) ($R^1$: —$CH_3$, $R^2$: —$C_2H_5$), a combination of the recurring unit (1) ($R^1$: —$CH_3$, $R^2$: —$CH_3$) and the recurring unit (5) ($R^1$: —$CH_3$, $R^2$: —$CH_3$), a combination of the recurring unit (1) ($R^1$: —$CH_3$, $R^2$: —$CH_3$) and the recurring unit (6) ($R^1$: —$CH_3$, $R^2$: —$CH_3$), a combination of the recurring unit (1) ($R^1$: —$CH_3$, $R^2$: —$C_2H_5$) and the recurring unit (2) ($R^1$: —$CH_3$, $R^2$: —$CH_3$), a combination of the recurring unit (1) ($R^1$: —$CH_3$, $R^2$: —$C_2H_5$) and the recurring unit (2) ($R^1$: —$CH_3$, $R^2$: —$C_2H_5$), a combination of the recurring unit (1) ($R^1$: —$CH_3$, $R^2$: —$C_2H_5$) and the recurring unit (2) ($R^1$: —$CH_3$, $R^2$: —$C_4H_9$), a combination of the recurring unit (1) ($R^1$: —$CH_3$, $R^2$: —$C_2H_5$) and the recurring unit (3) ($R^1$: —$CH_3$, $R^2$: —$CH_3$), a combination of the recurring unit (1) ($R^1$: —$CH_3$, $R^2$: —$C_2H_5$) and the recurring unit (3) ($R^1$: —$CH_3$, $R^2$: —$C_2H_5$), a combination of the recurring unit (1) ($R^1$: —$CH_3$, $R^2$: —$C_2H_5$) and the recurring unit (4) ($R^1$: —$CH_3$, $R^2$: —$CH_3$), a combination of the recurring unit (1) ($R^1$: —$CH_3$, $R^2$: —$C_2H_5$) and the recurring unit (4) ($R^1$: —$CH_3$, $R^2$: —$C_2H_5$), a combination of the recurring unit (1) ($R^1$: —$CH_3$, $R^2$: —$C_2H_5$) and the recurring unit (5) ($R^1$: —$CH_3$, $R^2$: —$CH_3$), a combination of the recurring unit (1) ($R^1$: —$CH_3$, $R^2$: —$C_2H_5$) and the recurring unit (6) ($R^1$: —$CH_3$, $R^2$: —$CH_3$), a combination of the recurring unit (2) ($R^1$: —$CH_3$, $R^2$: —$CH_3$) and the recurring unit (4) ($R^1$: —$CH_3$, $R^2$: —$CH_3$), a combination of the recurring unit (2) ($R^1$: —$CH_3$, $R^2$: —$CH_3$) and the recurring unit (4) ($R^1$: —$CH_3$, $R^2$: —$C_2H_5$), a combination of the recurring unit (2) ($R^1$: —$CH_3$, $R^2$: —$CH_3$) and the recurring unit (5) ($R^1$: —$CH_3$, $R^2$: —$CH_3$), a combination of the recurring unit (2) ($R^1$: —$CH_3$, $R^2$: —$CH_3$) and the recurring unit (6) ($R^1$: —$CH_3$, $R^2$: —$CH_3$), a combination of the recurring unit (3) ($R^1$: —$CH_3$, $R^2$: —$CH_3$) and the recurring unit (4) ($R^1$: —$CH_3$, $R^2$: —$CH_3$), a combination of the recurring unit (3) ($R^1$: —$CH_3$, $R^2$: —$CH_3$) and the recurring unit (4) ($R^1$: —$CH_3$, $R^2$: —$C_2H_5$), a combination of the recurring unit (3) ($R^1$: —$CH_3$, $R^2$: —$CH_3$) and the recurring unit (5) ($R^1$: —$CH_3$, $R^2$: —$CH_3$), a combination of the recurring unit (3) ($R^1$: —$CH_3$, $R^2$: —$CH_3$) and the recurring unit (6) ($R^1$: —$CH_3$, $R^2$: —$CH_3$), a combination of the recurring unit (4) ($R^1$: —$CH_3$, $R^2$: —$CH_3$) and the recurring unit (4) ($R^1$: —$CH_3$, $R^2$: —$C_2H_5$), a combination of the recurring unit (4) ($R^1$: —$CH_3$, $R^2$: —$CH_3$) and the recurring unit (5) ($R^1$: —$CH_3$, $R^2$: —$CH_3$), a combination of the recurring unit (4) ($R^1$: —$CH_3$, $R^2$: —$CH_3$) and the recurring unit (6) ($R^1$: —$CH_3$, $R^2$: —$CH_3$), a combination of the recurring unit (4) ($R^1$: —$CH_3$, $R^2$: —$C_2H_5$) and the recurring unit (2) ($R^1$: —$CH_3$, $R^2$: —$CH_3$), a combination of the recurring unit (4) ($R^1$: —$CH_3$, $R^2$: —$C_2H_5$) and the recurring unit (6) ($R^1$: —$CH_3$, $R^2$: —$CH_3$), a combination of the recurring unit (5) ($R^1$: —$CH_3$, $R^2$: —$CH_3$) and the recurring unit (6) ($R^1$: —$CH_3$, $R^2$: —$CH_3$), a combination of the recurring unit (1) ($R^1$: —H, $R^2$: —$CH_3$) and the recurring unit (1) ($R^1$: —H, $R^2$: —$C_2H_5$), a combination of the recurring unit (1) ($R^1$: —H, $R^2$: —$CH_3$) and the recurring unit (2) ($R^1$: —H, $R^2$: —$CH_3$), a combination of the recurring unit (1) ($R^1$: —H, $R^2$: —$CH_3$) and the recurring unit (2) ($R^1$: —H, $R^2$: —$C_2H_5$), a combination of the recurring unit (1) ($R^1$: —H, $R^2$: —$CH_3$) and the recurring unit (3) ($R^1$: —H, $R^2$: —$CH_3$), a combination of the recurring unit (1) ($R^1$: —H, $R^2$: —$CH_3$) and the recurring unit (3) ($R^1$: —H, $R^2$: —$C_2H_5$), a combination of the recurring unit (1) ($R^1$: —H, $R^2$: —$CH_3$) and the recurring unit (4) ($R^1$: —H, $R^2$: —$CH_3$), a combination of the recurring unit (1) ($R^1$: —H, $R^2$: —$CH_3$) and the recurring unit (4) ($R^1$: —H, $R^2$: —$C_2H_5$), a combination of the recurring unit (1) ($R^1$: —H, $R^2$: —$CH_3$) and the recurring unit (5) ($R^1$: —H, $R^2$: —$CH_3$), a combination of the recurring unit (1) ($R^1$: —H, $R^2$: —$CH_3$) and the recurring unit (6) ($R^1$: —H, $R^2$: —$CH_3$), a combination of the recurring unit (1) ($R^1$: —H, $R^2$: —$C_2H_5$) and the recurring unit (2) ($R^1$: —H, $R^2$: —$CH_3$), a combination of the recurring unit (1) ($R^1$: —H, $R^2$: —$C_2H_5$) and the recurring unit (2) ($R^1$: —H, $R^2$: —$C_2H_5$), a combination of the recurring unit (1) ($R^1$: —H, $R^2$: —$C_2H_5$) and the recurring unit (3) ($R^1$: —H, $R^2$: —$CH_3$), a combination of the recurring unit (1) ($R^1$: —H, $R^2$: —$C_2H_5$) and the recurring unit (3) ($R^1$: —H, $R^2$: —$C_2H_5$), a combination of the recurring unit (1) ($R^1$: —H, $R^2$: —$C_2H_5$) and the recurring unit (4) ($R^1$: —H, $R^2$: —$CH_3$), a combination of the recurring unit (1) ($R^1$: —H, $R^2$: —$C_2H_5$) and the recurring unit (4) ($R^1$: —H, $R^2$: —$C_2H_5$), a combination of the recurring unit (1) ($R^1$: —H, $R^2$: —$C_2H_5$) and the recurring unit (5) ($R^1$: —H, $R^2$: —$CH_3$), a combination of the recurring unit (1) ($R^1$: —H, $R^2$: —$C_2H_5$) and the recurring unit (6) ($R^1$: —H, $R^2$: —$CH_3$), a combination of the recurring unit (2) ($R^1$: —H, $R^2$: —$CH_3$) and the recurring unit (4) ($R^1$: —H, $R^2$: —$CH_3$), a combination of the recurring unit (2) ($R^1$: —H, $R^2$: —$CH_3$) and the recurring unit (4) ($R^1$: —H, $R^2$: —$C_2H_5$), a combination of the recurring unit (2) ($R^1$: —H, $R^2$: —$CH_3$) and the recurring unit (5) ($R^1$: —H, $R^2$: —$CH_3$), a combination of the recurring unit (2) ($R^1$: —H, $R^2$: —$CH_3$) and the recurring unit (6) ($R^1$: —H, $R^2$: —$CH_3$), a combination of the recurring unit (3) ($R^1$: —H, $R^2$: —$CH_3$) and the recurring unit (4) ($R^1$: —H, $R^2$: —$CH_3$), a combination of the recurring unit (3) ($R^1$: —H, $R^2$: —$CH_3$) and the recurring unit (4) ($R^1$: —H, $R^2$: —$C_2H_5$), a combination of the recurring unit (3) ($R^1$: —H, $R^2$: —$CH_3$) and the recurring unit (5) ($R^1$: —H, $R^2$: —$CH_3$), a combination of the recurring unit (3) ($R^1$: —H, $R^2$: —$CH_3$) and the recurring unit (6) ($R^1$: —H, $R^2$: —$CH_3$), a combination of the recurring unit (4) ($R^1$: —H, $R^2$: —$CH_3$) and the recurring unit (4) ($R^1$: —H, $R^2$: —$C_2H_5$), a combination of the recurring unit (4) ($R^1$: —H, $R^2$: —$CH_3$) and the recurring unit (5) ($R^1$: —H, $R^2$: —$CH_3$), a combination of the recurring unit (4) ($R^1$: —H, $R^2$: —$CH_3$) and the recurring unit (6) ($R^1$: —H, $R^2$: —$CH_3$), a combination of the recurring unit (4) ($R^1$: —H, $R^2$: —$C_2H_5$) and the recurring unit (5) ($R^1$: —H, $R^2$: —$CH_3$), a combination of the recurring unit (4) ($R^1$: —H, $R^2$: —$C_2H_5$) and the recurring unit (6) ($R^1$: —H, $R^2$: —$CH_3$), a combination of the recurring unit (5) ($R^1$: —H, $R^2$: —$CH_3$) and the recurring unit (6) ($R^1$: —H, $R^2$: —$CH_3$), a combination of the recurring unit (1) ($R^1$: —H, $R^2$: —$CH_3$) and the recurring unit (1) ($R^1$: —$CH_3$, $R^2$: —$C_2H_5$), a combination of the recurring unit (1) ($R^1$: —H, $R^2$: —$CH_3$) and the recurring unit (2) ($R^1$: —$CH_3$, $R^2$: —$CH_3$), a combination of the recurring unit (1) ($R^1$: —H, $R^2$: —$CH_3$) and the recurring unit (2) ($R^1$: —$CH_3$, $R^2$: —$C_2H_5$), a combination of the recurring unit (1) ($R^1$: —H, $R^2$: —$CH_3$) and the recurring unit (3) ($R^1$: —$CH_3$, $R^2$: —$CH_3$), a combination of the recurring unit (1) ($R^1$: —H, $R^2$: —$CH_3$) and the recurring unit (3) ($R^1$: —$CH_3$, $R^2$: —$C_2H_5$), a combination of the recurring unit (1) ($R^1$: —H, $R^2$: —$CH_3$) and the recurring unit (4) ($R^1$: —$CH_3$, $R^2$: —$CH_3$), a combination of the recurring unit (1) ($R^1$: —H, $R^2$: —$CH_3$) and the recurring unit (4) ($R^1$: —$CH_3$, $R^2$: —$C_2H_5$), a combination of the recurring unit (1) ($R^1$: —H, $R^2$: —$CH_3$) and the recurring unit (5) ($R^1$: —$CH_3$, $R^2$: —$CH_3$), a combination of the recurring unit (1) ($R^1$: —H, $R^2$: —$CH_3$) and the recurring unit (6) ($R^1$: —$CH_3$, $R^2$: —$CH_3$), a combination of the recurring unit (1) ($R^1$: —H, $R^2$: —$C_2H_5$) and the recurring unit (2) ($R^1$: —$CH_3$, $R^2$: —$CH_3$), a combination of the recurring unit (1) ($R^1$: —H, $R^2$: —$C_2H_5$) and the recurring unit (2) ($R^1$: —$CH_3$, $R^2$: —$C_2H_5$), a combination of the recurring unit (1) ($R^1$: —H, $R^2$: —$C_2H_5$) and the recurring unit (3) ($R^1$: —$CH_3$, $R^2$: —$CH_3$), a combination of the recurring unit (1) ($R^1$: —H, $R^2$: —$C_2H_5$) and the recurring unit (3) ($R^1$: —$CH_3$, $R^2$: —$C_2H_5$), a combination of the recurring unit (1) ($R^1$: —H, $R^2$: —$C_2H_5$) and the recurring unit (4) ($R^1$: —$CH_3$, $R^2$: —$CH_3$), a combination of the recurring unit (1) ($R^1$: —H, $R^2$: —$C_2H_5$) and the recurring unit (4) ($R^1$: —$CH_3$, $R^2$: —$C_2H_5$), a combination of the recurring unit (1) ($R^1$: —H, $R^2$: —$C_2H_5$) and the recurring unit (5) ($R^1$: —$CH_3$, $R^2$: —$CH_3$), a combination of the recurring unit (1) ($R^1$: —H, $R^2$: —$C_2H_5$) and the recurring unit (6) ($R^1$: —$CH_3$, $R^2$: —$CH_3$), a combination of the recurring unit (2) ($R^1$: —H, $R^2$: —$CH_3$) and the recurring unit (4) ($R^1$: —$CH_3$, $R^2$: —$CH_3$), a combination of the recurring unit (2) ($R^1$: —H, $R^2$: —$CH_3$) and the recurring unit (4) ($R^1$: —$CH_3$, $R^2$: —$C_2H_5$), a combination of the recurring unit (2) ($R^1$: —H, $R^2$: —$CH_3$) and the recurring unit (5) ($R^1$: —$CH_3$, $R^2$: —$CH_3$), a combination of the recurring unit (2) ($R^1$: —H, $R^2$: —$CH_3$) and the recurring unit (6) ($R^1$: —$CH_3$, $R^2$: —$CH_3$), a combination of the recurring unit (3) ($R^1$: —H, $R^2$: —$CH_3$) and the recurring unit (4) ($R^1$: —$CH_3$, $R^2$: —$CH_3$), a combination of the recurring unit (3) ($R^1$: —H, $R^2$: —$CH_3$) and the recurring unit (4) ($R^1$: —$CH_3$, $R^2$: —$C_2H_5$), a combination of the recurring unit (3) ($R^1$: —H, $R^2$: —$CH_3$) and the recurring unit (5) ($R^1$: —$CH_3$, $R^2$: —$CH_3$), a combination of the recurring unit (3) ($R^1$: —H, $R^2$: —$CH_3$) and the recurring unit (6) ($R^1$: —$CH_3$, $R^2$: —$CH_3$), a combination of the recurring unit (4) ($R^1$: —H, $R^2$: —$CH_3$) and the recurring unit (4) ($R^1$: —$CH_3$, $R^2$: —$C_2H_5$), a combination of the recurring unit (4) ($R^1$: —H, $R^2$: —$CH_3$) and the recurring unit (5) ($R^1$: —$CH_3$, $R^2$: —$CH_3$), a combination of the recurring unit (4) ($R^1$: —H, $R^2$: —$CH_3$) and the recurring unit (6) ($R^1$: —$CH_3$, $R^2$: —$CH_3$), a combination of the recurring unit (4) ($R^1$: —H, $R^2$: —$C_2H_5$) and the recurring unit (5) ($R^1$: —$CH_3$, $R^2$: —$CH_3$), a combination of the recurring unit (4) ($R^1$: —H, $R^2$: —$C_2H_5$) and the recurring unit (6) ($R^1$: —$CH_3$, $R^2$: —$CH_3$), a combination of the recurring unit (5) ($R^1$: —H, $R^2$: —$CH_3$) and the recurring unit (6) ($R^1$: —$CH_3$, $R^2$: —$CH_3$), a combination of the recurring unit (1) ($R^1$: —$CH_3$, $R^2$: —$CH_3$) and the recurring unit (1) ($R^1$: —H, $R^2$: —$C_2H_5$), a combination of the recurring unit (1) ($R^1$: —$CH_3$, $R^2$: —$CH_3$) and the recurring unit (2) ($R^1$: —H, $R^2$: —$CH_3$), a combination of the recurring unit (1) ($R^1$: —$CH_3$, $R^2$: —$CH_3$) and the recurring unit (2) ($R^1$: —H, $R^2$: —$C_2H_5$), a combination of the recurring unit (1) ($R^1$: —$CH_3$, $R^2$: —$CH_3$) and the recurring unit (2) ($R^1$: —H, $R^2$: —$C_4H_9$), a combination of the recurring unit (1) ($R^1$: —$CH_3$, $R^2$: —$CH_3$) and the recurring unit (3) ($R^1$: —H, $R^2$: —$CH_3$), a combination of the recurring unit (1) ($R^1$: —$CH_3$, $R^2$: —$CH_3$) and the recurring unit (3) ($R^1$: —H, $R^2$: —$C_2H_5$), a combination of the recurring unit (1) ($R^1$: —$CH_3$, $R^2$: —$CH_3$) and the recurring unit (4) ($R^1$: —H, $R^2$: —$CH_3$), a combination of the recurring unit (1) ($R^1$: —$CH_3$, $R^2$: —$CH_3$) and the recurring unit (4) ($R^1$: —H, $R^2$: —$C_2H_5$), a combination of the recurring unit (1) ($R^1$: —$CH_3$, $R^2$: —$CH_3$) and the recurring unit (5) ($R^1$: —H, $R^2$: —$CH_3$), a combination of the recurring unit (1) ($R^1$: —$CH_3$, $R^2$: —$CH_3$) and the recurring unit (6) ($R^1$: —H, $R^2$: —$CH_3$), a combination of the recurring unit (1) ($R^1$: —$CH_3$, $R^2$: —$C_2H_5$) and the recurring unit (2) ($R^1$: —H, $R^2$: —$CH_3$), a combination of the recurring unit (1) ($R^1$: —$CH_3$, $R^2$: —$C_2H_5$) and the recurring unit (2) ($R^1$: —H, $R^2$: —$C_2H_5$), a combination of the recurring unit (1) ($R^1$: —$CH_3$, $R^2$: —$C_2H_5$) and the recurring unit (3) ($R^1$: —H, $R^2$: —$CH_3$), a combination of the recurring unit (1) ($R^1$: —$CH_3$, $R^2$: —$C_2H_5$) and the recurring unit (3) ($R^1$: —H, $R^2$: —$C_2H_5$), a combination of the recurring unit (1) ($R^1$: —$CH_3$, $R^2$: —$C_2H_5$) and the recurring unit (4) ($R^1$: —H, $R^2$: —$CH_3$), a combination of the recurring unit (1) ($R^1$: —$CH_3$, $R^2$: —$C_2H_5$) and the recurring unit (4) ($R^1$: —H, $R^2$: —$C_2H_5$), a combination of the recurring unit (1) ($R^1$: —$CH_3$, $R^2$: —$C_2H_5$) and the recurring unit (5) ($R^1$: —H, $R^2$: —$CH_3$), a combination of the recurring unit (1) ($R^1$: —$CH_3$, $R^2$: —$C_2H_5$) and the recurring unit (6) ($R^1$: —H, $R^2$: —$CH_3$), a combination of the recurring unit (2) ($R^1$: —$CH_3$, $R^2$: —$CH_3$) and the recurring unit (4) ($R^1$: —H, $R^2$: —$CH_3$), a combination of the recurring unit (2) ($R^1$: —$CH_3$, $R^2$: —$CH_3$) and the recurring unit (4) ($R^1$: —H, $R^2$: —$C_2H_5$), a combination of the recurring unit (2) ($R^1$: —$CH_3$, $R^2$: —$CH_3$) and the recurring unit (5) ($R^1$: —H, $R^2$: —$CH_3$), a combination of the recurring unit (2) ($R^1$: —$CH_3$, $R^2$: —$CH_3$) and the recurring unit (6) ($R^1$: —H, $R^2$: —$CH_3$), a combination of the recurring unit (3) ($R^1$: —$CH_3$, $R^2$: —$CH_3$) and the recurring unit (4) ($R^1$: —H, $R^2$: —$CH_3$), a combination of the recurring unit (3) ($R^1$: —$CH_3$, $R^2$: —$CH_3$) and the recurring unit (2) ($R^1$: —H, $R^2$: —$C_2H_5$), a combination of the recurring unit (3) ($R^1$: —$CH_3$, $R^2$: —$CH_3$) and the recurring unit (5) ($R^1$: —H, $R^2$: —$CH_3$), a combination of the recurring unit (3) ($R^1$: —$CH_3$, $R^2$: —$CH_3$) and the recurring unit (6) ($R^1$: —H, $R^2$: —$CH_3$), a combination of the recurring unit (4) ($R^1$: —$CH_3$, $R^2$: —$CH_3$) and the recurring unit (4) ($R^1$: —H, $R^2$: —$C_2H_5$), a combination of the recurring unit (4) ($R^1$: —$CH_3$, $R^2$: —$CH_3$) and the recurring unit (5) ($R^1$: —H, $R^2$: —$CH_3$), a combination of the recurring unit (4) ($R^1$: —$CH_3$, $R^2$: —$CH_3$) and the recurring unit (6) ($R^1$: —H, $R^2$: —$CH_3$), a combination of the recurring unit (4) ($R^1$: —$CH_3$, $R^2$: —$C_2H_5$) and the recurring unit (5) ($R^1$: —H, $R^2$: —$CH_3$), a combination of the recurring unit (4) ($R^1$: —$CH_3$, $R^2$: —$C_2H_5$) and the recurring unit (6) ($R^1$: —H, $R^2$: —$CH_3$), and a combination of the recurring unit (5) ($R^1$: —$CH_3$, $R^2$: —$CH_3$) and the recurring unit (6) ($R^1$: —H, $R^2$: —$CH_3$), can be given.

Of these, as particularly preferable combinations of the recurring units, a combination of the recurring unit (1) ($R^1$: —$CH_3$, $R^2$: —$CH_3$) and the recurring unit (1) ($R^1$: —$CH_3$, $R^2$: —$C_2H_5$), a combination of the recurring unit (1) ($R^1$: —$CH_3$, $R^2$: —$CH_3$) and the recurring unit (2) ($R^1$: —$CH_3$, $R^2$: —$CH_3$), a combination of the recurring unit (1) ($R^1$: —$CH_3$, $R^2$: —$CH_3$) and the recurring unit (3) ($R^1$: —$CH_3$, $R^2$: —$C_2H_5$), a combination of the recurring unit (1) ($R^1$: —$CH_3$, $R^2$: —$CH_3$) and the recurring unit (4) ($R^1$: —$CH_3$, $R^2$: —$CH_3$), a combination of the recurring unit (1) ($R^1$: —$CH_3$, $R^2$: —$CH_3$) and the recurring unit (5) ($R^1$: —$CH_3$, $R^2$: —$CH_3$), a combination of the recurring unit (1) ($R^1$: —$CH_3$, $R^2$: —$CH_3$) and the recurring unit (6) ($R^1$: —$CH_3$, $R^2$: —$CH_3$), a combination of the recurring unit (1) ($R^1$: —$C_2H_5$) and the recurring unit (2) ($R^1$: —$CH_3$, $R^2$: —$CH_3$), a combination of the recurring unit (1) ($R^1$: —$C_2H_5$) and the recurring unit (3) ($R^1$: —$CH_3$, $R^2$: —$C_2H_5$), a combination of the recurring unit (1) ($R^1$: —$C_2H_5$) and the recurring unit (5) ($R^1$: —$CH_3$, $R^2$: —$CH_3$), a combination of the recurring unit (1) ($R^1$: —$C_2H_5$) and the recurring unit (6) ($R^1$: —$CH_3$, $R^2$: —$CH_3$), a combination of the recurring unit (2) ($R^1$: —$CH_3$, $R^2$: —$CH_3$) and the recurring unit (5) ($R^1$: —$CH_3$, $R^2$: —$CH_3$), a combination of the recurring unit (2) ($R^1$: —$CH_3$, $R^2$: —$CH_3$) and the recurring unit (6) ($R^1$: —$CH_3$, $R^2$: —$CH_3$), a combination of the recurring unit (3) ($R^1$: —$CH_3$, $R^2$: —$CH_3$) and the recurring unit (5) ($R^1$: —$CH_3$, $R^2$: —$CH_3$), a combination of the recurring unit (3) ($R^1$: —$CH_3$, $R^2$: —$CH_3$) and the recurring unit (6) ($R^1$: —$CH_3$, $R^2$: —$CH_3$), a combination of the recurring unit (4) ($R^1$: —$CH_3$, $R^2$: —$CH_3$) and the recurring unit (5) ($R^1$: —$CH_3$, $R^2$: —$CH_3$),
a combination of the recurring unit (4) ($R^1$: —$CH_3$, $R^2$: —$CH_3$) and the recurring unit (6) ($R^1$: —$CH_3$, $R^2$: —$CH_3$),
a combination of the recurring unit (4) ($R^1$: —$CH_3$, $R^2$: —$C_2H_5$) and the recurring unit (5) ($R^1$: —$CH_3$, $R^2$: —$CH_3$),
a combination of the recurring unit (4) ($R^1$: —$CH_3$, $R^2$: —$C_2H_5$) and the recurring unit (6) ($R^1$: —$CH_3$, $R^2$: —$CH_3$),
a combination of the recurring unit (5) ($R^1$: —$CH_3$, $R^2$: —$CH_3$) and the recurring unit (6) ($R^1$: —$CH_3$, $R^2$: —$CH_3$),
a combination of the recurring unit (1) ($R^1$: —H, $R^2$: —$CH_3$) and the recurring unit (1) ($R^1$: —H, $R^2$: —$C_2H_5$),
a combination of the recurring unit (1) ($R^1$: —H, $R^2$: —$CH_3$) and the recurring unit (2) ($R^1$: —H, $R^2$: —$CH_3$),
a combination of the recurring unit (1) ($R^1$: —H, $R^2$: —$CH_3$) and the recurring unit (3) ($R^1$: —H, $R^2$: —$C_2H_5$),
a combination of the recurring unit (1) ($R^1$: —H, $R^2$: —$CH_3$) and the recurring unit (4) ($R^1$: —H, $R^2$: —$CH_3$),
a combination of the recurring unit (1) ($R^1$: —H, $R^2$: —$CH_3$) and the recurring unit (5) ($R^1$: —H, $R^2$: —$CH_3$),
a combination of the recurring unit (1) ($R^1$: —H, $R^2$: —$CH_3$) and the recurring unit (6) ($R^1$: —H, $R^2$: —$CH_3$),
a combination of the recurring unit (1) ($R^1$: —H, $R^2$: —$C_2H_5$) and the recurring unit (2) ($R^1$: —H, $R^2$: —$CH_3$),
a combination of the recurring unit (1) ($R^1$: —H, $R^2$: —$C_2H_5$) and the recurring unit (3) ($R^1$: —H, $R^2$: —$C_2H_5$),
a combination of the recurring unit (1) ($R^1$: —H, $R^2$: —$C_2H_5$) and the recurring unit (5) ($R^1$: —H, $R^2$: —$CH_3$),
a combination of the recurring unit (1) ($R^1$: —H, $R^2$: —$C_2H_5$) and the recurring unit (6) ($R^1$: —H, $R^2$: —$CH_3$),
a combination of the recurring unit (2) ($R^1$: —H, $R^2$: —$CH_3$) and the recurring unit (5) ($R^1$: —H, $R^2$: —$CH_3$),
a combination of the recurring unit (2) ($R^1$: —H, $R^2$: —$CH_3$) and the recurring unit (6) ($R^1$: —H, $R^2$: —$CH_3$),
a combination of the recurring unit (3) ($R^1$: —H, $R^2$: —$CH_3$) and the recurring unit (5) ($R^1$: —H, $R^2$: —$CH_3$),
a combination of the recurring unit (3) ($R^1$: —H, $R^2$: —$CH_3$) and the recurring unit (6) ($R^1$: —H, $R^2$: —$CH_3$),
a combination of the recurring unit (4) ($R^1$: —H, $R^2$: —$CH_3$) and the recurring unit (5) ($R^1$: —H, $R^2$: —$CH_3$),
a combination of the recurring unit (4) ($R^1$: —H, $R^2$: —$CH_3$) and the recurring unit (6) ($R^1$: —H, $R^2$: —$CH_3$),
a combination of the recurring unit (4) ($R^1$: —H, $R^2$: —$C_2H_5$) and the recurring unit (5) ($R^1$: —H, $R^2$: —$CH_3$),
a combination of the recurring unit (4) ($R^1$: —H, $R^2$: —$CH_3$) and the recurring unit (6) ($R^1$: —H, $R^2$: —$CH_3$),
a combination of the recurring unit (5) ($R^1$: —H, $R^2$: —$CH_3$) and the recurring unit (6) ($R^1$: —H, $R^2$: —$CH_3$),
a combination of the recurring unit (1) ($R^1$: —$CH_3$, $R^2$: —$CH_3$) and the recurring unit (1) ($R^1$: —H, $R^2$: —$C_2H_5$),
a combination of the recurring unit (1) ($R^1$: —$CH_3$, $R^2$: —$CH_3$) and the recurring unit (2) ($R^1$: —H, $R^2$: —$CH_3$),
a combination of the recurring unit (1) ($R^1$: —$CH_3$, $R^2$: —$CH_3$) and the recurring unit (3) ($R^1$: —H, $R^2$: —$C_2H_5$),
a combination of the recurring unit (1) ($R^1$: —$CH_3$, $R^2$: —$CH_3$) and the recurring unit (4) ($R^1$: —H, $R^2$: —$CH_3$),
a combination of the recurring unit (1) ($R^1$: —$CH_3$, $R^2$: —$CH_3$) and the recurring unit (5) ($R^1$: —H, $R^2$: —$CH_3$),
a combination of the recurring unit (1) ($R^1$: —$CH_3$, $R^2$: —$CH_3$) and the recurring unit (6) ($R^1$: —H, $R^2$: —$CH_3$),
a combination of the recurring unit (1) ($R^1$: —$CH_3$, $R^2$: —$C_2H_5$) and the recurring unit (2) ($R^1$: —H, $R^2$: —$CH_3$),
a combination of the recurring unit (1) ($R^1$: —$CH_3$, $R^2$: —$C_2H_5$) and the recurring unit (3) ($R^1$: —H, $R^2$: —$C_2H_5$),
a combination of the recurring unit (1) ($R^1$: —$CH_3$, $R^2$: —$C_2H_5$) and the recurring unit (5) ($R^1$: —H, $R^2$: —$CH_3$),
a combination of the recurring unit (1) ($R^1$: —$CH_3$, $R^2$: —$C_2H_5$) and the recurring unit (6) ($R^1$: —H, $R^2$: —$CH_3$),
a combination of the recurring unit (2) ($R^1$: —$CH_3$, $R^2$: —$CH_3$) and the recurring unit (5) ($R^1$: —H, $R^2$: —$CH_3$),
a combination of the recurring unit (2) ($R^1$: —$CH_3$, $R^2$: —$CH_3$) and the recurring unit (6) ($R^1$: —H, $R^2$: —$CH_3$),
a combination of the recurring unit (3) ($R^1$: —$CH_3$, $R^2$: —$CH_3$) and the recurring unit (5) ($R^1$: —H, $R^2$: —$CH_3$),
a combination of the recurring unit (3) ($R^1$: —$CH_3$, $R^2$: —$CH_3$) and the recurring unit (6) ($R^1$: —H, $R^2$: —$CH_3$),
a combination of the recurring unit (4) ($R^1$: —$CH_3$, $R^2$: —$CH_3$) and the recurring unit (5) ($R^1$: —H, $R^2$: —$CH_3$),
a combination of the recurring unit (4) ($R^1$: —$CH_3$, $R^2$: —$CH_3$) and the recurring unit (6) ($R^1$: —H, $R^2$: —$CH_3$),
a combination of the recurring unit (4) ($R^1$: —$CH_3$, $R^2$: —$C_2H_5$) and the recurring unit (5) ($R^1$: —H, $R^2$: —$CH_3$),
a combination of the recurring unit (4) ($R^1$: —$CH_3$, $R^2$: —$C_2H_5$) and the recurring unit (6) ($R^1$: —H, $R^2$: —$CH_3$),
a combination of the recurring unit (5) ($R^1$: —$CH_3$, $R^2$: —$CH_3$) and the recurring unit (6) ($R^1$: —H, $R^2$: —$CH_3$),
a combination of the recurring unit (1) ($R^1$: —H, $R^2$: —$CH_3$) and the recurring unit (1) ($R^1$: —$CH_3$, $R^2$: —$C_2H_5$),
a combination of the recurring unit (1) ($R^1$: —H, $R^2$: —$CH_3$) and the recurring unit (2) ($R^1$: —$CH_3$, $R^2$: —$CH_3$),
a combination of the recurring unit (1) ($R^1$: —H, $R^2$: —$CH_3$) and the recurring unit (3) ($R^1$: —$CH_3$, $R^2$: —$C_2H_5$),
a combination of the recurring unit (1) ($R^1$: —H, $R^2$: —$CH_3$) and the recurring unit (4) ($R^1$: —$CH_3$, $R^2$: —$CH_3$),
a combination of the recurring unit (1) ($R^1$: —H, $R^2$: —$CH_3$) and the recurring unit (5) ($R^1$: —$CH_3$, $R^2$: —$CH_3$),
a combination of the recurring unit (1) ($R^1$: —H, $R^2$: —$CH_3$) and the recurring unit (6) ($R^1$: —$CH_3$, $R^2$: —$CH_3$),
a combination of the recurring unit (1) ($R^1$: —H, $R^2$: —$C_2H_5$) and the recurring unit (2) ($R^1$: —$CH_3$, $R^2$: —$CH_3$),
a combination of the recurring unit (1) ($R^1$: —H, $R^2$: —$C_2H_5$) and the recurring unit (3) ($R^1$: —$CH_3$, $R^2$: —$C_2H_5$),
a combination of the recurring unit (1) ($R^1$: —H, $R^2$: —$C_2H_5$) and the recurring unit (5) ($R^1$: —$CH_3$, $R^2$: —$CH_3$),
a combination of the recurring unit (1) ($R^1$: —H, $R^2$: —$C_2H_5$) and the recurring unit (6) ($R^1$: —$CH_3$, $R^2$: —$CH_3$),
a combination of the recurring unit (2) ($R^1$: —H, $R^2$: —$CH_3$) and the recurring unit (5) ($R^1$: —$CH_3$, $R^2$: —$CH_3$),
a combination of the recurring unit (2) ($R^1$: —H, $R^2$: —$CH_3$) and the recurring unit (6) ($R^1$: —$CH_3$, $R^2$: —$CH_3$),
a combination of the recurring unit (3) ($R^1$: —H, $R^2$: —$CH_3$) and the recurring unit (5) ($R^1$: —$CH_3$, $R^2$: —$CH_3$),
a combination of the recurring unit (3) ($R^1$: —H, $R^2$: —$CH_3$) and the recurring unit (6) ($R^1$: —$CH_3$, $R^2$: —$CH_3$),
a combination of the recurring unit (4) ($R^1$: —H, $R^2$: —$CH_3$) and the recurring unit (5) ($R^1$: —$CH_3$, $R^2$: —$CH_3$),
a combination of the recurring unit (4) ($R^1$: —H, $R^2$: —$CH_3$) and the recurring unit (6) ($R^1$: —$CH_3$, $R^2$: —$CH_3$),
a combination of the recurring unit (4) ($R^1$: —H, $R^2$: —$C_2H_5$) and the recurring unit (5) ($R^1$: —$CH_3$, $R^2$: —$CH_3$), a combination of the recurring unit (4) (R¹: —H, R²: —C₂H₅) and the recurring unit (6) (R¹: —CH₃, R²: —CH₃), and a combination of the recurring unit (5) (R¹: —H, R²: —CH₃) and the recurring unit (6) (R¹: —CH₃, R²: —CH₃) can be given.

The resin (A) is a polymer having at least two recurring units selected from the recurring units of the above formulas (1)–(6), and preferably at least two recurring units selected from the recurring units of the above formulas (1) to (3).

Another preferable example of the resin (A) is a polymer having at least one recurring unit selected from the recurring units of the above formula (6), wherein R² is a methyl group, and at least one recurring unit selected from the recurring units of the above formulas (1) to (3).

A more preferable example of the resin (A) is a polymer having at least one recurring unit selected from the recurring units of the above formulas (1) to (3), wherein R² is a methyl group, and at least one recurring unit selected from the recurring units of the above formulas (1) to (3), wherein R² is a substituted or unsubstituted alkyl group having 2–4 carbon atoms.

The polystyrene-reduced weight average molecular weight (hereinafter referred to as "Mw") of the resin (A) determined by gel permeation chromatography (GPC) is usually 3,000–30,000, preferably 5,000–30,000, and still more preferably 5,000–20,000. If the Mw of the resin (A) is less than 3,000, heat resistance of the resulting resist may be decreased. If the Mw exceeds 30,000, developability of the resulting resist may be decreased.

The ratio of Mw to the polystyrene-reduced number average molecular weight (hereinafter referred to as "Mn") determined by gel permeation chromatography (GPC) (Mw/Mn) of the resin (A) is usually 1–5, and preferably 1–3.

The resin (A) may be prepared by polymerizing the polymerizable unsaturated monomers corresponding to the recurring units forming a desired molecular composition in an appropriate solvent in the presence of a chain transfer agent, as required, using a radical polymerization initiator such as a hydroperoxide, dialkyl peroxide, diacyl peroxide, or azo compound.

Examples of the solvent used for polymerizing the monomer include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; and ethers such as tetrahydrofuran, dimethoxyethanes, and diethoxyethanes. These solvents may be used either individually or in combination of two or more.

The polymerization temperature is usually 40–120° C., and preferably 50–90° C. The reaction time is usually 1–48 hours, and preferably 1–24 hours.

It is preferable that the resin (A) contain almost no impurities such as halogens and metals. The smaller the amount of impurities, the better the sensitivity, resolution, process stability, and pattern profile of the resist. The resin (A) may be purified by using a chemical purification process such as washing with water or liquid-liquid extraction or a combination of the chemical purification process and a physical purification process such as ultrafiltration or centrifugation, for example.

In the present invention, the resin (A) may be used either individually or in combination of two or more.

Component (B)

The component (B) of the present invention is a photoacid generator which generates an acid upon exposure (hereinafter referred to as "acid generator (B)").

The acid generator (B) causes the acid-dissociable group in the resin (A) to dissociate by the action of an acid generated upon exposure. As a result, exposed areas of the resist film become readily soluble in an alkaline developer, whereby a positive-tone resist pattern is formed.

The acid generator (B) of the present invention preferably comprises a compound represented by the following formula (7) (hereinafter referred to as "an acid generator (B*)").

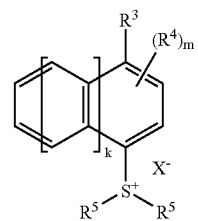

(7)

wherein R³ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, R⁴ represents a linear or branched alkyl group having 1–10 carbon atoms, R⁵ individually represents a linear or branched alkyl group having 1–10 carbon atoms, substituted or unsubstituted phenyl group, or substituted or unsubstituted naphthyl group, or two R⁵ groups bond to form a substituted or unsubstituted divalent group having 2–10 carbon atoms, k is an integer of 0 to 2, X⁻ represents an anion represented by the formula R⁶C$_n$F$_{2n}$SO₃⁻ (wherein R⁶ represents a fluorine atom or substituted or unsubstituted monovalent hydrocarbon group and n is an integer of 1 to 10), and m is an integer of 0 to 10.

Examples of the linear or the branched alkyl group having 1–10 carbon atoms for R³, R⁴, or R⁵ in the formula (7) include a methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, and n-decyl group.

Of these alkyl groups, a methyl group, ethyl group, n-butyl group, t-butyl group, and the like are preferable.

Examples of the linear or branched alkoxyl group having 1–10 carbon atoms represented by R³ include a methoxy group, ethoxy group, n-propoxy group, i-propoxy group, n-butoxy group, 2-methylpropoxy group, 1-methylpropoxy group, t-butoxy group, n-pentyloxy group, neopentyloxy group, n-hexyloxy group, n-heptyloxy group, n-octyloxy group, 2-ethylhexyloxy group, n-nonyloxy group, and n-decyloxy group.

Of these alkoxyl groups, a methoxy group, ethoxy group, n-butoxy group, and the like are preferable.

Examples of the linear or branched alkoxycarbonyl group having 2–11 carbon atoms represented by R³ include a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, neopentyloxycarbonyl group, n-hexyloxycarbonyl group, n-heptyloxycarbonyl group, n-octyloxycarbonyl group, 2-ethylhexyloxycarbonyl group, n-nonyloxycarbonyl group, and n-decyloxycarbonyl group.

Of these alkoxycarbonyl groups, a methoxycarbonyl group, ethoxycarbonyl group, n-butoxycarbonyl group, and the like are preferable.

Preferable groups for $R^3$ in the formula (7) are a hydrogen atom, hydroxyl group, methoxy group, ethoxy group, n-butoxy group, and the like.

Preferable groups for $R^4$ in the formula (7) are a methyl group, ethyl group, t-butyl group, and the like.

m is preferably an integer of 0 to 2.

Examples of the substituted or unsubstituted phenyl group for $R^5$ in the formula (7) include a phenyl group, phenyl groups substituted with a linear, branched, or cyclic alkyl group having 1–10 carbon atoms such as an o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, 4-ethylphenyl group, 4-t-butylphenyl group, and 4-cyclohexylphenyl group; and groups obtained by substituting one or more hydrogen atoms in the phenyl group or alkyl-substituted phenyl groups with one or more groups such as a hydroxyl group, carboxyl group, cyano group, nitro group, alkoxyl group, alkoxyalkyl group, alkoxycarbonyl group, and alkoxycarbonyloxy group.

Examples of the alkoxyl group as the substituent for the phenyl group or alkyl-substituted phenyl group include linear, branched, or cyclic alkoxyl groups having 1–20 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group.

Examples of the alkoxyalkyl group include linear, branched, or cyclic alkoxyalkyl groups having 2–21 carbon atoms such as a methoxymethyl group, ethoxymethyl group, 1-methoxyethyl group, 2-methoxyethyl group, 1-ethoxyethyl group, and 2-ethoxyethyl group.

Examples of the alkoxycarbonyl group include linear, branched, or cyclic alkoxycarbonyl groups having 2–21 carbon atoms such as a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, cyclopentyloxycarbonyl group, and cyclohexyloxycarbonyl group.

Examples of the alkoxycarbonyloxy group include linear, branched, or cyclic alkoxycarbonyloxy groups having 2–21 carbon atoms such as a methoxycarbonyloxy group, ethoxycarbonyloxy group, n-propoxycarbonyloxy group, i-propoxycarbonyloxy group, n-butoxycarbonyloxy group, t-butoxycarbonyloxy group, cyclopentyloxycarbonyl group, and cyclohexyloxycarbonyl group.

Preferable phenyl groups which may have a substituent represented by $R^5$ in the formula (7) are a phenyl group, 4-cyclohexylphenyl group, 4-t-butylphenyl group, 4-methoxyphenyl group, 4-t-butoxyphenyl group, and the like.

Examples of the substituted or unsubstituted naphthyl group for $R^5$ include naphthyl groups substituted or unsubstituted with a linear, branched, or cyclic alkyl group having 1–10 carbon atoms such as a naphthyl group, 1-naphthyl group, 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 2-naphthyl group, 1-methyl-2-naphthyl group, 3-methyl-2-naphthyl group, and 4-methyl-2-naphthyl group; and groups obtained by further substituting one or more hydrogen atoms in the naphthyl group or alkyl-substituted naphthyl group with a hydroxyl group, carboxyl group, cyano group, nitro group, alkoxyl group, alkoxyalkyl group, alkoxycarbonyl group, or alkoxycarbonyloxy group.

As examples of the alkoxyl group, alkoxyalkyl group, alkoxycarbonyl group, and alkoxycarbonyloxy group which are the substituents, the groups illustrated for the phenyl group and alkyl-substituted phenyl groups can be given.

As a naphtyl group which may have a substituent represented by $R^5$ in the formula (5), 1-naphthyl group, 1-(4-methoxynaphthyl) group, 1-(4-ethoxynaphthyl) group, 1-(4-n-butoxynaphthyl) group, and the like are preferable.

As an example of the divalent group having 2–10 carbon atoms formed by two $R^5$ groups, a group forming a 5 or 6 member ring together with the sulfur atom in the formula (7), particularly preferably a 5 member ring (i.e. tetrahydrothiophene ring) is preferable.

As examples of the substituent for the above divalent groups, the groups previously mentioned for the phenyl group and alkyl-substituted phenyl groups, such as a hydroxyl group, carboxyl group, cyano group, nitro group, alkoxyl group, alkoxyalkyl group, alkoxycarbonyl group, and alkoxycarbonyloxy group can be given.

As the group $R^5$ in the formula (7), a methyl group, ethyl group, phenyl group, 4-methoxyphenyl group, and 1-naphthyl group, and a divalent group with a tetrahydrothiophene cyclic structure formed from the two $R^5$ groups and the sulfur atom, and the like are preferable.

In the formula (7), the $C_nF_{2n}^-$ group in the anion $R^6C_nF_{2n}SO_3^-$ represented by $X^-$ is a perfluoroalkylene group, with the alkylene group being either linear or branched and n being preferably 2, 4, or 8. As ahydrocarbon group having 1–12 carbon atoms which may have a substituent represented by $R^6$, an alkyl group having 1–12 carbon atoms, cycloalkyl group having 3–12 carbon atoms, or a bridge alicyclic hydrocarbon group having 12 or less carbon atoms are preferable. As specific examples, methyl group, ethyl group, n-propyl group, i-propyl group, n-butyl group, 2-methylpropyl group, 1-methylpropyl group, t-butyl group, n-pentyl group, neopentyl group, n-hexyl group, cyclohexyl group, n-heptyl group, n-octyl group, 2-ethylhexyl group, n-nonyl group, n-decyl group, norbornyl group, hydroxynorbornyl group, and adamantyl group can be given.

Specific examples of the acid generator (B*) include:
triphenylsulfonium trifluoromethanesulfonate,
triphenylsulfonium nonafluoro-n-butanesulfonate,
triphenylsulfonium perfluoro-n-octanesulfonate,
triphenylsulfonium 2-bicyclo[2.2.1]heptan-2-yl-1,1,2,2-tetrafluoroethanesulfonate,
tri-t-butylphenylsulfonium trifluoromethanesulfonate,
tri-t-butylphenylsulfonium nonafluoro-n-butanesulfonate,
tri-t-butylphenylsulfonium perfluoro-n-octanesulfonate,
tri-t-butylphenylsulfonium 2-bicyclo[2.2.1]heptan-2-yl-1,1,2,2-tetrafluoroethanesulfonate, 4-cyclohexylphenyldiphenylsulfonium trifluoromethanesulfonate,
4-cyclohexylphenyl-diphenylsulfonium nonafluoro-n-butanesulfonate,
4-cyclohexylphenyl-diphenylsulfonium perfluoro-n-octanesulfonate,
4-cyclohexylphenyl-diphenylsulfonium 2-bicyclo[2.2.1]heptan-2-yl-1,1,2,2-tetrafluoroethanesulfonate,
1-naphthyldimethylsulfonium trifluoromethanesulfonate,
1-naphthyldimethylsulfonium nonafluoro-n-butanesulfonate,
1-naphthyldimethylsulfonium perfluoro-n-octanesulfonate,
1-naphthyldimethylsulfoniumtrifluoromethanesulfonate 2-bicyclo[2.2.1]heptan-2-yl-1,1,2,2-tetrafluoroethanesulfonate,
1-naphthyldiethylsulfonium trifluoromethanesulfonate,
1-naphthyldiethylsulfonium nonafluoro-n-butanesulfonate,
1-naphthyldiethylsulfonium perfluoro-n-octanesulfonate,
1-naphthyldiethylsulfonium 2-bicyclo[2.2.1]heptan-2-yl-1,1,2,2-tetrafluoroethanesulfonate,
1-(4-hydroxynaphthyl)dimethylsulfonium trifluoromethanesulfonate,
1-(4-hydroxynaphthyl)dimethylsulfonium nonafluoro-n-butanesulfonate,
1-(4-hydroxynaphthyl)dimethylsulfonium perfluoro-n-octanesulfonate,
1-(4-hydroxynaphthyl)dimethylsulfonium 2-bicyclo[2.2.1]heptan-2-yl-1,1,2,2-tetrafluoroethanesulfonate,
1-(4-hydroxynaphthyl)diethylsulfonium trifluoromethanesulfonate,
1-(4-hydroxynaphthyl)diethylsulfonium nonafluoro-n-butanesulfonate,
1-(4-hydroxynaphthyl)diethylsulfonium perfluoro-n-octanesulfonate,
1-(4-hydroxynaphthyl)diethylsulfonium 2-bicyclo[2.2.1]heptan-2-yl-1,1,2,2-tetrafluoroethanesulfonate,
1-(4-methylnaphthyl)dimethylsulfonium trifluoromethanesulfonate,
1-(4-methylnaphthyl)dimethylsulfonium nonafluoro-n-butanesulfonate,
1-(4-methylnaphthyl)dimethylsulfonium perfluoro-n-octanesulfonate,
1-(4-methylnaphthyl)dimethylsulfonium 2-bicyclo[2.2.1]heptan-2-yl-1,1,2,2-tetrafluoroethanesulfonate,
1-(4-methylnaphthyl)diethylsulfonium trifluoromethanesulfonate,
1-(4-methylnaphthyl)diethylsulfonium nonafluoro-n-butanesulfonate,
1-(4-methylnaphthyl)diethylsulfonium perfluoro-n-octanesulfonate,
1-(4-methylnaphthyl)diethylsulfonium 2-bicyclo[2.2.1]heptan-2-yl-1,1,2,2-tetrafluoroethanesulfonate,
1-(4-cyanonaphthyl)dimethylsulfonium trifluoromethanesulfonate,
1-(4-cyanonaphthyl)dimethylsulfonium nonafluoro-n-butanesulfonate,
1-(4-cyanonaphthyl)dimethylsulfonium perfluoro-n-octanesulfonate,
1-(4-cyanonaphthyl)dimethylsulfonium 2-bicyclo[2.2.1]heptan-2-yl-1,1,2,2-tetrafluoroethanesulfonate,
1-(4-cyanonaphthyl)diethylsulfonium trifluoromethanesulfonate,
1-(4-cyanonaphthyl)diethylsulfonium nonafluoro-n-butanesulfonate,
1-(4-cyanonaphthyl)diethylsulfonium perfluoro-n-octanesulfonate,
1-(4-cyanonaphthyl)diethylsulfonium 2-bicyclo[2.2.1]heptan-2-yl-1,1,2,2-tetrafluoroethanesulfonate,
1-(4-nitronaphthyl)dimethylsulfonium trifluoromethanesulfonate,
1-(4-nitronaphthyl)dimethylsulfonium nonafluoro-n-butanesulfonate,
1-(4-nitronaphthyl)dimethylsulfonium perfluoro-n-octanesulfonate,
1-(4-nitronaphthyl)dimethylsulfonium 2-bicyclo[2.2.1]heptan-2-yl-1,1,2,2-tetrafluoroethanesulfonate,
1-(4-nitronaphthyl)diethylsulfonium trifluoromethanesulfonate,
1-(4-nitronaphthyl)diethylsulfonium nonafluoro-n-butanesulfonate,
1-(4-nitronaphthyl)diethylsulfonium perfluoro-n-octanesulfonate,
1-(4-nitronaphthyl)diethylsulfonium 2-bicyclo[2.2.1]heptan-2-yl-1,1,2,2-tetrafluoroethanesulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(3,5-dimethyl-4-hydroxyphenyl)tetrahydrothiophenium 2-(bicyclo[2.2.1]heptan-2-yl)-1,1,2,2-tetrafluoroethanesulfonate,
1-(4-methoxynaphthyl)tetrahydrothiophenium trifluoromethanesulfonate,
1-(4-methoxynaphthyl)tetrahydrothiophenium nonafluoro-n-butanesulfonate,
1-(4-methoxynaphthyl)tetrahydrothiopheniumperfluoro-n-octanesulfonate,
1-(4-methoxynaphthyl)tetrahydrothiophenium 2-(bicyclo[2.2.1]heptan-2-yl)-1,1,2,2-tetrafluoroethanesulfonate,
1-(4-ethoxynaphthyl)tetrahydrothiophenium trifluoromethanesulfonate,
1-(4-ethoxynaphthyl)tetrahydrothiophenium nonafluoro-n-butanesulfonate,
1-(4-ethoxynaphthyl)tetrahydrothiopheniumperfluoro-n-octanesulfonate,
1-(4-ethoxynaphthyl)tetrahydrothiophenium 2-(bicyclo[2.2.1]heptan-2-yl)-1,1,2,2-tetrafluoroethanesulfonate,
1-(4-n-butoxynaphthyl)tetrahydrothiophenium trifluoromethanesulfonate,
1-(4-n-butoxynaphthyl)tetrahydrothiophenium nonafluoro-n-butanesulfonate,
1-(4-n-butoxynaphthyl)tetrahydrothiopheniumperfluoro-n-octanesulfonate, and
1-(4-n-butoxynaphthyl)tetrahydrothiophenium 2-(bicyclo[2.2.1]heptan-2-yl)-1,1,2,2-tetrafluoroethanesulfonate.
Of these acid generators (B*),
triphenylsulfonium nonafluoro-n-butanesulfonate,
tri-t-butylphenylsulfonium nonafluoro-n-butanesulfonate,
4-cyclohexylphenyl-diphenylsulfonium nonafluoro-n-butanesulfonate,
triphenylsulfonium perfluoro-n-octanesulfonate,
triphenylsulfonium 2-bicyclo[2.2.1]heptan-2-yl-1,1,2,2-tetrafluoroethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(3,5-dimethyl-4-hydroxyphenyl)tetrahydrothiophenium 2-(bicyclo[2.2.1]heptan-2-yl)-1,1,2,2-tetrafluoroethanesulfonate, 1-(4-n-butoxynaphthyl)tetrahydrothiophenium nonafluoro-n-butanesulfonate, 1-(4-n-butoxynaphthyl)tetrahydrothiopheniumperfluoro-n-octanesulfonate, and 1-(4-n-butoxynaphthyl)tetrahydrothiophenium 2-(bicyclo[2.2.1]heptan-2-yl)-1,1,2,2-tetrafluoroethanesulfonate are preferable.

In the present invention, the acid generator (B*) may be used either individually or in combination of two or more.

As examples of the acid generator other than the acid generator (B*) which can be used as the acid generator (B) (hereinafter called "other acid generators"), onium salt compounds, halogen-containing compounds, diazoketone compounds, sulfone compounds, sulfonic acid compounds, and the like can be given.

Specific examples of the other acid generator are as follows.

Onium Salt:

As examples of the onium salt, iodonium salt, sulfonium salt, phosphonium salt, diazonium salt, and pyridinium salt can be given.

Specific examples of the onium salt include:
diphenyliodonium trifluoromethanesulfonate,
diphenyliodonium nonafluoro-n-butanesulfonate,
diphenyliodonium perfluoro-n-octanesulfonate,
diphenyliodonium 2-bicyclo[2.2.1]heptan-2-yl-1,1,2,2-tetrafluoroethanesulfonate,
bis(4-t-butylphenyl)iodonium trifluoromethane sulfonate,
bis(4-t-butylphenyl)iodonium nonafluoro-n-butanesulfonate,
bis(4-t-butylphenyl)iodonium perfluoro-n-octanesulfonate,
bis(4-t-butylphenyl)iodonium 2-(bicyclo[2.2.1]heptan-2-yl)-1,1,2,2-tetrafluoroethane-sulfonate,
cyclohexyl.2-oxocyclohexyl-methylsulfonium trifluoromethanesulfonate,
dicyclohexyl.2-oxocyclohexylsulfonium trifluoromethanesulfonate, and
2-oxocyclohexyldimethylsulfonium trifluoromethanesulfonate.

Halogen-containing Compound:

As examples of the halogen-containing compound, haloalkyl group-containing hydrocarbon compounds, and haloalkyl group-containing heterocyclic compounds can be given.

Specific examples of the halogen-containing compound include:
(trichloromethyl)-s-triazine derivatives such as
phenylbis(trichloromethyl)-s-triazine,
4-methoxyphenylbis(trichloromethyl)-s-triazine, and
1-naphthylbis(trichloromethyl)-s-triazine; and
1,1-bis(4-chlorophenyl)-2,2,2-trichloroethane.

Diazoketone Compound:

As examples of the diazoketone compound, 1,3-diketo-2-diazo compounds, diazobenzoquinone compounds, and diazonaphthoquinone compounds can be given.

As specific examples of the diazomethane compound,
1,2-naphthoquinonediazido-4-sulfonyl chloride,
1,2-naphthoquinonediazido-5-sulfonyl chloride,
1,2-naphthoquinonediazido-4-sulfonate or
1,2-naphthoquinonediazido-5-sulfonate of
2,3,4,4'-tetrahydroxybenzophenone, and
1,2-naphthoquinonediazido-4-sulfonate or
1,2-naphthoquinonediazido-5-sulfonate of
1,1,1-tris(4-hydroxyphenyl)ethane can be given.

Sulfone Compound:

As examples of the sulfone compound, β-ketosulfone, β-sulfonylsulfone, and α-diazo compounds of these compounds can be given.

As specific examples of the sulfone compound, 4-trisphenacylsulfone, mesitylphenacylsulfone, bis(phenylsulfonyl)methane, and the like can be given.

Sulfonic Acid Compound:

As examples of the sulfonic acid compound, alkyl sulfonate, alkylimide sulfonate, haloalkyl sulfonate, aryl sulfonate, and imino sulfonate can be given.

Specific examples of the sulfonic acid compound include benzointosylate, tris(trifluoromethanesulfonate) of pyrogallol nitrobenzyl-9,10-diethoxyanthracene-2-sulfonate,
trifluoromethanesulfonylbicyclo[2.2.1]hept-5-ene-2,3-dicarbodiimide,
nonafluoro-n-butanesulfonylbicyclo[2.2.1]hept-5-ene-2,3-dicarbodiimide,
perfluoro-n-octanesulfonylbicyclo[2.2.1]hept-5-ene-2,3-dicarbodiimide,
2-bicyclo[2.2.1]heptan-2-yl-1,1,2,2-tetrafluoroethane-sulfonyloxy bicyclo[2.2.1]hept-5-ene-2,3-dicarbodiimide,
N-(trifluoromethanesulfonyloxy)succinimide,
N-(nonafluoro-n-butanesulfonyloxy)succinimide,
N-(perfluoro-n-octanesulfonyloxy)succinimide,
N-(2-(bicyclo[2.2.1]heptan-2-yl)-1,1,2,2-tetrafluoroethanesulfonyloxy)succinimide,
1,8-naphthalenedicarboxylic acid imide trifluoromethanesulfonate,
1,8-naphthalenedicarboxylic acid imide nonafluoro-n-butanesulfonate,
and 1,8-naphthalenedicarboxylic acid imide perfluoro-n-octanesulfonate.

Of these other acid generators,
diphenyliodonium trifluoromethanesulfonate,
diphenyliodonium nonafluoro-n-butanesulfonate,
diphenyliodonium perfluoro-n-octanesulfonate,
diphenyliodonium 2-bicyclo[2.2.1]heptan-2-yl-1,1,2,2-tetrafluoroethanesulfonate,
bis(4-t-butylphenyl)iodoniumtrifluoromethane sulfonate,
bis(4-t-butylphenyl)iodonium nonafluoro-n-butanesulfonate,
bis(4-t-butylphenyl)iodonium perfluoro-n-octanesulfonate,
bis(4-t-butylphenyl)iodonium 2-(bicyclo[2.2.1]heptan-2-yl)-1,1,2,2-tetrafluoroethanesulfonate,
cyclohexyl.2-oxocyclohexyl.methylsulfonium trifluoromethanesulfonate,
dicyclohexyl.2-oxocyclohexylsulfonium trifluoromethanesulfonate,
2-oxocyclohexylmethylsulfonium trifluoromethanesulfonate, trifluoromethanesulfonylbicyclo[2.2.1]hept-5-ene-2,3-dicarbodiimide,
nonafluoro-n-butanesulfonylbicyclo[12.2.]hept-5-ene-2,3-dicarbodiimide,
perfluoro-n-octanesulfonylbicyclo[2.2.1]hept-5-ene-2,3-dicarbodiimide,
2-bicyclo[2.2.1]heptan-2-yl-1,1,2,2-tetrafluoroethanesulfonyloxy bicyclo[2.2.1]hept-5-ene-2,3-dicarbodiimide,
N-(trifluoromethanesulfonyloxy)succinimide,
N-(nonafluoro-n-butanesulfonyloxy)succinimide,
N-(perfluoro-n-octanesulfonyloxy)succinimide,
N-(2-(bicyclo[2.2.1]heptan-2-yl)-1,1,2,2-tetrafluoroethanesulfonyloxy)succinimide,
1,8-naphthalenedicarboxylic acid imide trifluoromethanesulfonate, and the like are preferable.

These other acid generators may be used either individually or in combination of two or more.

As the acid generator (B), the acid generator (B*) is preferable. A combination of the acid generator (B*) and other acid generators is also preferable. When the other acid generators are used, the proportion of the other acid generators is usually 80 wt % or less, and preferably 60 wt % or less of the total amount of the acid generator (B*) and the other acid generators.

In the present invention, the total amount of the acid generator (B) is usually 0.1–20 parts by weight, and preferably 0.5–10 parts by weight of 100 parts by weight of the resin (A) in order to ensure sensitivity and developability of the resist. If this total amount is less than 0.1 part by weight, sensitivity and developability tend to decrease. If the amount exceeds 20 parts by weight, a rectangular resist pattern may not be obtained due to decreased radiation transmittance.

Other Components

Various types of additives such as acid diffusion controllers, alicyclic compounds having an acid-dissociable group, surfactants, and sensitizers may optionally be added to the radiation-sensitive resin composition of the present invention.

The acid diffusion controllers control diffusion of an acid generated from the acid generator upon exposure in the resist film to suppress undesired chemical reactions in the unexposed area.

The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) between exposure and post exposure heat treatment, whereby a composition with remarkably superior process stability can be obtained.

As the acid diffusion controller, nitrogen-containing organic compounds of which the basicity does not change due to exposure or heat treatment during formation of a resist pattern are preferable.

As examples of such a nitrogen-containing organic compound, compounds shown by the following formula (8) (hereinafter called "nitrogen-containing compounds (a)"), compounds having two nitrogen atoms in the molecule (hereinafter called "nitrogen-containing compounds (b)"), polyamino compounds or polymers having three or more nitrogen atoms (hereinafter collectively called "nitrogen-containing compounds (c)"), amide group-containing compounds, urea compounds, nitrogen-containing heterocyclic compounds, and the like can be given:

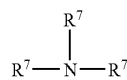

(8)

wherein $R^7$ individually represents a hydrogen atom, a substituted or unsubstituted linear, branched, or cyclic alkyl group, substituted or unsubstituted aryl group, or substituted or unsubstituted aralkyl group.

Examples of the nitrogen-containing compound (a) include: mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine; and the like.

Examples of the nitrogen-containing compound (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, and bis(2-diethylaminoethyl)ether.

As examples of the nitrogen-containing compound (c), polyethyleneimine, polyallylamine, and a polymer of 2-dimethylaminoethylaminoethylacrylamide can be given.

As examples of the amide group-containing compound, in addition to N-t-butoxycarbonyl group-containing amino compounds such as
N-t-butoxycarbonyldi-n-octylamine,
N-t-butoxycarbonyldi-n-nonylamine,
N-t-butoxycarbonyldi-n-decylamine,
N-t-butoxycarbonyldicyclohexylamine,
N-t-butoxycarbonyl-1-adamantylamine,
N-t-butoxycarbonyl-N-methyl-1-adamantylamine,
N,N-di-t-butoxycarbonyl-1-adamantylamine,
N,N-di-t-butoxycarbonyl-N-methyl-1-adamantylamine,
N-t-butoxycarbonyl-4,4'-diaminodiphenylmethane,
N,N'-di-t-butoxycarbonyl hexamethylenediamine,
N,N,N',N'-tetra-t-butoxycarbonyl hexamethylenediamine,
N,N'-di-t-butoxycarbonyl-1,7-diaminoheptane hexamethylenediamine,
N,N'-di-t-butoxycarbonyl-1,8-diaminooctane,
N,N'-di-t-butoxycarbonyl-1,9-diaminononane,
N,N'-di-t-butoxycarbonyl-1,10-diaminodecane,
N,N'-di-t-butoxycarbonyl-1,12-diaminododecane,
N,N'-di-t-butoxycarbonyl-4,4-diaminodiphenylmethane,
N-t-butoxycarbonylbenzimidazole,
N-t-butoxycarbonyl-2-methylbenzimidazole, and
N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, and N-methylpyrrolidone can be given.

As examples of the urea compound, urea, methylurea, 1,1-dimethylurea, 1,3-dimethylurea, 1,1,3,3-tetramethylurea, 1,3-diphenylurea, and tri-n-butylthiourea can be given.

Examples of the nitrogen-containing heterocyclic compound include imidazoles such as imidazole, 4-methylimidazole, 4-methyl-2-phenylimidazole, benzimidazole, 2-phenylbenzimidazole, and N-t-butoxycarbonyl-2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)

piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane; and the like.

Of these nitrogen-containing organic compounds, the nitrogen-containing compounds (a), amide group-containing compounds, nitrogen-containing heterocyclic compounds, and the like are preferable.

The acid diffusion controller may be used either individually or in combination of two or more.

The alicyclic compounds having an acid-dissociable group improve dry etching resistance, pattern profile, and adhesion to the substrate.

Examples of such an alicyclic compound include adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; and lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate.

These alicyclic compounds may be used either individually or in combination of two or more.

Surfactants improve applicability, striation, developability, and the like.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

These surfactants may be used either individually or in combination of two or more.

The sensitizers absorb radiation energy and transmit the energy to the acid generator (B), thereby increasing the amount of an acid to be generated upon exposure. The sensitizers improve apparent sensitivity of the radiation-sensitive resin composition.

As examples of the sensitizer, acetophenones, benzophenones, naphthalenes, biacetyl, Eosine, Rose Bengal, pyrenes, anthracenes, and phenothiazines, and the like can be given.

These sensitizers may be used either individually or in combination of two or more. Addition of dyes or pigments visualizes a latent image in the exposed area, thereby decreasing the effects of halation during exposure. Use of adhesion improvers improves adhesion to the substrates.

As other additives, alkali-soluble resins described later, low molecular weight alkali solubility controllers containing an acid dissociable protecting group, halation inhibitors, preservation stabilizers, antifoaming agents, and the like can be given.

Solvent

When the composition of the present invention is used, the above-described components are usually dissolved in a solvent.

As the solvent, at least one compound selected from the group consisting of propylene glycol mono-methyl ether acetate, 2-heptanone, and cyclohexanone (hereinafter referred to as "solvent (c)" is preferable.

Solvents other than the above solvents (hereinafter referred to as "other solvents") can also be used. A mixture of the above solvents and the other solvents may also be used.

Examples of such other solvents include: propylene glycol monoalkyl ether acetates such as propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, and 2-octanone; cyclic ketones such as cyclopentanone, 3-methylcyclopentanone, 2-methylcyclohexanone, 2,6-dimethylcyclohexanone, and isophorone; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate.

Among these other solvents, linear or branched ketones, cyclic ketones, propylene glycol monoalkyl ether acetates, alkyl 2-hydroxypropionates, and alkyl 3-alkoxypropionates are preferable. These other solvents may be used either individually or in combination of two or more.

When the solvent (C) is used together with the other solvents, the proportion of the other solvents is usually 50 wt % or less, preferably 30 wt % or less, and still more preferably 25 wt % or less of the total weight of the solvents.

The solvent is used in the radiation-sensitive resin composition of the present invention in an amount to make the total solid content of the composition usually 5–70 wt %, preferably 10–25 wt %, and more preferably 10–20 wt %.

The radiation-sensitive resin composition of the present invention is prepared by dissolving the resin (A), acid generator (B), and additives in the solvent to make a homogeneous solution, which is then preferably passed through a filter with a pore size of 0.2 µm, for example, before use.

Formation of Resist Pattern

The radiation-sensitive resin composition of the present invention is particularly useful as a chemically-amplified resist.

In the chemically-amplified resist, an acid-dissociable group in the resin (A) dissociates by the action of an acid generated from the acid generator upon exposure, thereby producing a carboxyl group. As a result, solubility of the exposed part of the resist in an alkaline developer increases, whereby the exposed part is dissolved in an alkaline developer and removed to obtain a positive-tone resist pattern.

A resist pattern is formed from the radiation-sensitive resin composition of the present invention by applying the composition solution to, for example, substrates such as a silicon wafer and a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, electron beams, or the like are appropriately selected depending on types of the acid generator. It is particularly preferable to use an ArF excimer laser (wavelength: 193 nm) or KrF excimer laser (wavelength: 248 nm) An ArF excimer laser (wavelength: 193 nm) is particularly preferable.

In the present invention, it is preferable to perform post-exposure bake (hereinafter called "PEB"). PEB ensures smooth dissociation of the acid-dissociable group in the resin (A). The heating temperature for the PEB is usually 30–200° C., and preferably 50–170° C., although the heating conditions are changed depending on the composition of the radiation-sensitive resin composition.

In order to bring out maximum potentiality of the radiation-sensitive resin composition of the present invention, an organic or inorganic anti-reflection film may be formed on a substrate as disclosed in Japanese Patent Publication No.1994-12452, for example. Moreover, a protection film may be formed on the resist film as disclosed in Japanese Patent Application Laid-open No. 1993-188598 or the like in order to prevent the effects of basic impurities and the like in an environmental atmosphere. These techniques may be employed in combination.

The exposed resist film is then developed to form a specific resist pattern.

As examples of the developer used for development, alkaline aqueous solutions prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene are preferable.

The concentration of the alkaline aqueous solution is usually 10 wt % or less. If the concentration of the alkaline aqueous solution exceeds 10 wt %, an unexposed part may be dissolved in the developer.

Organic solvents or the like may be added to the developer containing an alkaline aqueous solution.

As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvent to be used is preferably 100 vol % or less of the alkaline aqueous solution. The amount of the organic solvent exceeding 100 vol % may decrease developability, giving rise to a larger undeveloped portion in the exposed area.

In addition, surfactants or the like may be added to the developer containing the alkaline aqueous solution in an appropriate amount.

After development using the alkaline aqueous solution developer, the resist film is generally washed with water and dried.

EXAMPLES

The present invention is described below in more detail by examples. However, these examples should not be construed as limiting the present invention. In the examples, "part" refers to "part by weight" unless otherwise indicated.

Measurement and evaluation in the examples and comparative examples were carried out according to the following procedures.

Mw

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Radiation Transmittance A composition solution was applied to a quartz plate by spin coating and baked on a hot plate at 130° C. for 90 seconds to obtain a resist film with a thickness of 0.34 μm. The radiation transmittance of the resist film was calculated from the absorbance at a wavelength of 193 nm and was employed as a standard for transparency in the deep UV ray region.

Sensitivity

A solution composition was applied to a silicon wafer with a 820 Å thickness ARC25 film (manufactured by Brewer Science Corp.) coated on the surface by spin coating and baked on a hot plate at 120° C. for 90 seconds to obtain a resist coating with a thickness of 0.27 μm. The coating was exposed to radiation through a mask pattern using an ArF excimer laser exposure apparatus (manufactured by Nikon Corp., lens numerical aperture: 0.55, wavelength: 193 nm). After performing PEB on a hot plate at 110° C. for 90 seconds, the resist films were developed in a 2.38 wt % tetramethylammonium hydroxide aqueous solution at 25° C. for one minute, washed with water, and dried to form a positive-tone resist pattern. An optimum dose capable of forming a 0.16 μm line-and-space pattern (1L1S) with a 1:1 line width was taken as sensitivity.

Resolution

Minimum dimensions of the resist pattern resolved at the optimum dose were taken as the resolution.

Dry-etching Resistance

A composition solution was applied to a silicon wafer by spin coating and dried to form a resist film with a thickness of 0.5 μm. Then, the resist film was dry-etched using a Pinnacle 8000 (manufactured by PMT Co.) and $CF_4$ as an etching gas at a flow rate of 75 sccm (1 scsm=a gas flow rate of 1 cc/min at 1 atm, 0° C.) and an output of 2,500 W under a gas pressure of 2.5 m Torr to measure the etching rate. The relative etching rate was calculated assuming the etching rate of a resin film formed from the composition solution prepared in the later-described Comparative Example 1 as 1.0. The smaller the etching rate, the better the dry-etching resistance.

Pattern Profile

The dimensions of the lower side $L_1$ and the upper side $L_2$ of the rectangular cross-section of a line and space pattern (1L1S) with a line width of 0.16 μm were measured using a scanning electron microscope. A pattern profile which satisfied a formula "$0.85 \leq L_2/L_1 \leq 1$" and was straight with no extended skirt was evaluated as "Good", and otherwise evaluated as "Bad".

Sensitivity 2

In Examples 14–22 and Comparative Example 2, the composition solution was applied to a wafer substrate, on which an ARC29A film with a thickness of 770 Å (manufactured by Nissan Chemical Industries, Ltd.) had been formed, by spin coating and baked on a hot plate under the conditions shown in Table 3 to obtain a resist coating with a thickness of 0.20 μm. The coating was exposed to light through a mask pattern using a full field reduced projection exposure apparatus (S306, manufactured by Nikon Corp., lens numerical aperture: 0.75). After performing PEB under the conditions shown in the Table 3, the resist film was developed at 25° C. for 60 seconds in a 2.38 wt % TMAH aqueous solution, washed with water, and dried to form a positive-tone resist pattern. An optimum dose at which a 1:1 line-and-space pattern with a line width of 110 nm was formed through a 1:1 line-and-space mask with a size of 110 nm was taken as sensitivity 2.

Sensitivity 3

In Examples 14–22 and Comparative Example 2, the composition solution was applied to a wafer substrate, on which an ARC29A film with a thickness of 770 Å (manufactured by Nissan Chemical Industries, Ltd.) had been formed, by spin coating and baked on a hot plate under the conditions shown in Table 3 to obtain a resist coating with a thickness of 0.20 μm. The coating was exposed to light through a mask pattern using a full field reduced projection exposure apparatus (S306, manufactured by Nikon Corp., lens numerical aperture: 0.75). After performing PEB under the conditions shown in the Table 3, the resist film was developed at 25° C. for 60 seconds in a 2.38 wt % TMAH aqueous solution, washed with water, and dried to form a positive-tone resist pattern. An optimum dose at which a pattern with a line width of 70 nm was formed through a 1:10 line-and-space (1L10S) mask with a size of 100 nm was taken as sensitivity 3.

Iso/sense Bias (nm)

In Examples 14–22 and Comparative Example 2, when the line width formed via a 1:1.2 line-and-space mask with a size of 100 nm at the sensitivity 3 is CD3, the difference determined by the following formula is defined as the crude density difference.

$$(Iso/\text{sense bias}) = (CD3 - 70)$$

In the case where the absolute value of the above formula was less than 15 nm, the iso/sense bias was judged as "Good" and otherwise as "Bad".

Space DOF

In the Examples 14–20 and Comparative Examples 2–3, a mask of an isolated space with any size making the line width of 120 nm for the isolated space formed at the sensitivity 2 was sought. The 120 nm isolated space was inspected using the mask and the DOF range at that time was measured. In the case where the range was less than 0.3 μm, the space DOF was judged as "Bad" and otherwise as "Good".

PEB Temperature Dependency

In the Examples 14–20 and Comparative Examples 2–3, PB/PEB conditions forming a 110 nm line-and-space at the sensitivity 2 was taken as a standard. The sample was evaluated at PEB temperatures of ±2° C. of the standard PEB temperature. The actual line widths for the 110 nm line-and-space at the sensitivity 2 were respectively indicated as CD1 (+2° C.) and CD2 (−2° C.). Based on the line width measurement, the line width variation due to PEB temperature variation was calculated using the following formula, the result of which was regarded as the PEB temperature dependency.

$$(PEB \text{ temperature dependency}) = (CD2 - CD1)/4 \text{ [nm/° C.]}$$

The smaller the value, the better the sample.

Synthesis Example 1

A homogeneous monomer solution was prepared by dissolving 26.46 g (25 mol %) of a compound with $R^1$: —$CH_3$ and $R^2$: —$CH_3$ in the formula (1m) (compound (a)), 13.30 g (15 mol %) of a compound with $R^1$: —$CH_3$ and $R^2$: —$C_2H_5$ in the formula (3m) (compound (b)), 60.24 g (60 mol %) of norbornene lactone methacrylate of the formula (9) (compound (c)), and 6.24 g of dimethyl azobisisobutyrate in 300 g of 2-butanone.

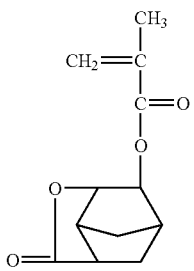

(9)

A 1,000 ml three-necked flask containing 100 g of 2-butanone was purged with nitrogen gas for 30 minutes and heated to 80° C. with stirring. The above monomer solution was added to the flask using a dropping funnel at a rate of 12 ml/5 min. The polymerization was carried out for five hours at 80° C. after initiation of dropping. After the polymerization, the polymer solution was cooled to 30° C. or less and poured into 2,000 g of methanol. White precipitate produced was collected by filtration. The obtained white powder was mixed with 400 g of methanol and the resulting slurry was stirred. After repeating this washing procedure twice, the white powder was filtered and dried for 17 hours at 50° C. to obtain a white resin powder (69 g, yield 69 wt %).

This resin was a copolymer with a Mw of 6,500 in which the ratio of the recurring unit (1) ($R^1$: —$CH_3$ and $R^2$: —$CH_3$), the recurring unit (3) ($R^1$: —$CH_3$ and $R^2$: —$C_2H_5$), and the recurring unit derived from the compound (c) represented by the formula (10) was 25.1:14.0:60.9 (mol %).

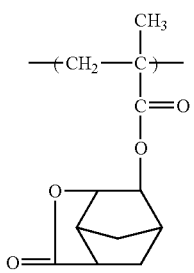

(10)

This resin is referred to as a "resin (A-1)".

Synthesis Example 2

A homogeneous monomer solution was prepared by dissolving 20.53 g (25 mol %) of a compound with $R^1$: —$CH_3$ and $R^2$: —$CH_3$ in the formula (2m) (compound (d)), 14.37 g (15 mol %) of the compound (b), 65.10 g (60 mol %) of the compound (c), and 6.74 g of dimethyl azobisisobutyrate in 300 g of 2-butanone, and processed in the same manner as in Synthesis Example 1 to obtain a white resin powder (73 g, yield 73 wt %).

This resin was a copolymer with a Mw of 7,200 in which the ratio of the recurring unit (2) ($R^1$: —$CH_3$ and $R^2$: —$CH_3$), the recurring unit (3) ($R^1$: —$CH_3$ and $R^2$: —$C_2H_5$), and the recurring unit of the formula (10) was 24.8:14.5:60.7 (mol %). This resin is referred to as a "resin (A-2)".

Synthesis Example 3

A homogeneous monomer solution was prepared by dissolving 25.56 g (25 mol %) of a compound with $R^1$: —$CH_3$ and $R^2$: —$CH_3$ in the formula (4m) (compound (e)), 16.26 g (15 mol %) of a compound with $R^1$: —$CH_3$ and $R^2$: —$C_2H_5$ in the formula (4m) (compound (f)), 58.18 g (60 mol %) of the compound (c), and 6.02 g of dimethyl azobisisobutyrate in 300 g of 2-butanone, and processed in the same manner as in Synthesis Example 1 to obtain a white resin powder (78 g, yield 78 wt %).

This resin was a copolymer with a Mw of 7,600 in which the ratio of the recurring unit (4) ($R^1$: —$CH_3$ and $R^2$: —$CH_3$), the recurring unit (4) ($R^1$: —$CH_3$ and $R^2$: —$C_2H_5$), and the recurring unit of the formula (10) was 24.8:14.4:60.8 (mol %). This resin is referred to as a "resin (A-3)".

Synthesis Example 4

A homogeneous monomer solution was prepared by dissolving 25.03 g (25 mol %) of the compound (a), 21.23 g (20 mol %) of a compound with $R^1$: —$CH_3$ and $R^2$: —$C_2H_5$ in the formula (1m) (compound (g)), 28.49 g (30 mol %) of the compound (c), 25.25 g (25 mol %) of 3-hydroxy-1-adamantyl methacrylate (compound (h)) of the following formula (11), and 6.00 g of dimethyl azobisisobutyrate in 200 g of 2-butanone, and processed in the same manner as in Synthesis Example 1 to obtain a white resin powder (75 g, yield 75 wt %).

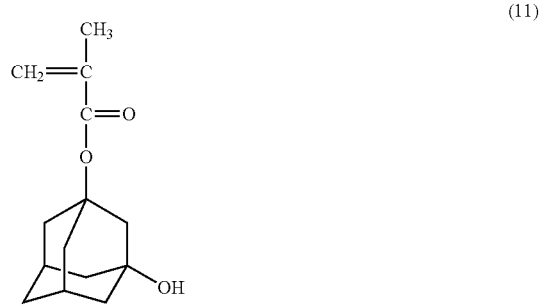

(11)

This resin was a copolymer with a Mw of 7,300 in which the ratio of the recurring unit (1) ($R^1$: —$CH_3$ and $R^2$: —$CH_3$), the recurring unit (1) ($R^1$: —$CH_3$ and $R^2$: —$C_2H_5$), the recurring unit of the formula (10), and the recurring unit of the following formula (12) was 25.1:14.0:31.1:29.8 (mol %).

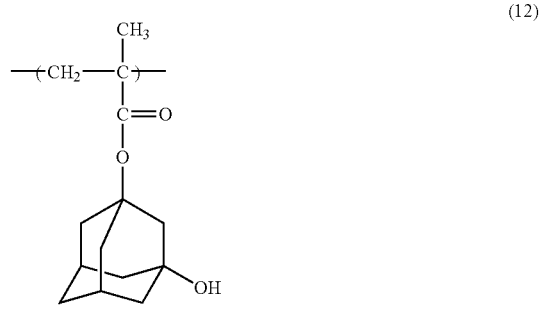

(12)

This resin is referred to as a "resin (A-4)".

Synthesis Example 5

A homogeneous monomer solution was prepared by dissolving 38.59 g (38 mol %) of the compound (a), 16.14 g (15 mol) of a compound with $R^1$: —$CH_3$ and $R^2$: —$C_2H_5$ in the formula (1m) (compound (g)), 45.27 g.(47 mol %) of the compound (c), and 5.98 g of dimethyl azobisisobutyrate in 300 g of 2-butanone, and processed in the same manner as in Synthesis Example 1 to obtain a white resin powder (72 g, yield 72 wt %).

This resin was a copolymer with a Mw of 7,000 in which the ratio of the recurring unit (1) ($R^1$: —$CH_3$ and $R^2$: —$CH_3$), the recurring unit (1) ($R^1$: —$CH_3$ and $R^2$: —$C_2H_5$), and the recurring unit of the formula (10) was 37.1:13.0:49.9 (mol %). This resin is referred to as a "resin (A-5)".

Synthesis Example 6

A homogeneous monomer solution was prepared by dissolving 38.24 g (38 mol %) of the compound (a), 16.90 g (15 mol) of a compound with $R^1$: —$CH_3$ and $R^2$: —$CH_3$ in the formula (5m) (compound (m)), 44.86 g (47 mol %) of the compound (c), and 5.93 g of dimethyl azobisisobutyrate in 300 g of 2-butanone, and processed in the same manner as in Synthesis Example 1 to obtain a white resin powder (71 g, yield 71 wt %).

This resin was a copolymer with a Mw of 7,600 in which the ratio of the recurring unit (1) ($R^1$: —$CH_3$ and $R^2$: —$CH_3$), the recurring unit (5) ($R^1$: —$CH_3$ and $R^2$: —$CH_3$), and the recurring unit of the formula (10) was 37.5:15.1:47.4 (mol %). This resin is referred to as a "resin (A-6)".

Synthesis Example 7

A homogeneous monomer solution was prepared by dissolving 39.25 g (38 mol %) of the compound (a), 14.70 g (15 mol) of a compound with $R^1$: —$CH_3$ and $R^2$: —$CH_3$ in the formula (6m) (compound (i)), 46.05 g (47 mol %) of the compound (c), and 6.09 g of dimethyl azobisisobutyrate in 300 g of 2-butanone, and processed in the same manner as in Synthesis Example 1 to obtain a white resin powder (77 g, yield 77 wt %).

This resin was a copolymer with a Mw of 7,800 in which the ratio of the recurring unit (1) ($R^1$: —$CH_3$ and $R^2$: —$CH_3$), the recurring unit (6) ($R^1$: —$CH_3$ and $R^2$: —$CH_3$), and the recurring unit of the formula (10) was 37.7:14.7:47.6 (mol %). This resin is referred to as a "resin (A-7)".

Synthesis Example 8

A homogeneous monomer solution was prepared by dissolving 16.07 g (15 mol %) of a compound with $R^1$: —H and $R^2$: —$C_2H_5$ in the formula (1m) (compound (j)), 36.18 g (38 mol %) of a compound with $R^1$: —H and $R^2$: —$CH_3$ in the formula (6m) (compound (k)), 47.75 g (47 mol %) of the compound (c), and 6.31 g of dimethyl azobisisobutyrate in 300 g of 2-butanone, and processed in the same manner as in Synthesis Example 1 to obtain a white resin powder (75 g, yield 75 wt %).

This resin was a copolymer with a Mw of 7,300 in which the ratio of the recurring unit (1) ($R^1$: —H and $R^2$: —$C_2H_5$), the recurring unit (6) ($R^1$: —H and $R^2$: —$CH_3$), and the recurring unit of the formula (10) was 13.9:37.2:48.9 (mol %). This resin is referred to as a "resin (A-8)".

Synthesis Example 9

A homogeneous monomer solution was prepared by dissolving 36.72 g (35 mol %) of the compound (a), 16.68 g (15 mol) of the compound (g), and 46.61 g (50 mol %) of lactone acrylate (compound 1)) of the following formula (13), and 6.18 g of dimethyl azobisisobutyrate in 300 g of 2-butanone, and processed in the same manner as in Synthesis Example 1 to obtain a white resin powder (76 g, yield 76 wt %).

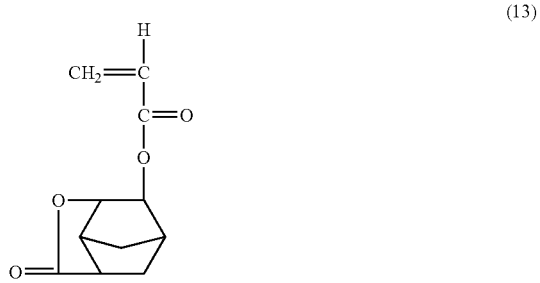

(13)

This resin was a copolymer with a Mw of 5,600 in which the ratio of the recurring unit (1) ($R^1$: —$CH_3$ and $R^2$: —$CH_3$), the recurring unit (1) ($R^1$: —$CH_3$ and $R^2$: —$C_2H_5$), and the recurring unit derived from the compound (1) represented by the formula (14) was 34.2:14.1:51.7 (mol %).

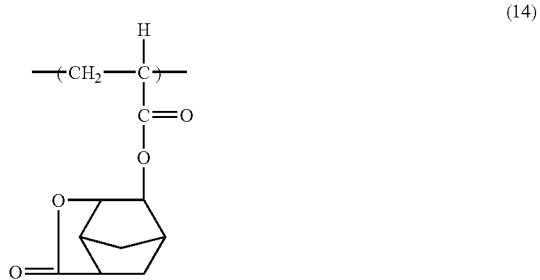

(14)

This resin is referred to as a "resin (A-9)".

Synthesis Example 10

A homogeneous monomer solution was prepared by dissolving 36.37 g (35 mol %) of the compound (a), 17.46 g (15 mol) of a compound with $R^1$: —$CH_3$ and $R^2$: —$CH_3$ in the formula (5m) (compound (m)), 47.03 g (50 mol %) of the compound (1), and 6.12 g of dimethyl azobisisobutyrate in 300 g of 2-butanone, and processed in the same manner as in Synthesis Example 1 to obtain a white resin powder (77 g, yield 77 wt %).

This resin was a copolymer with a Mw of 5,600 in which the ratio of the recurring unit (1) ($R^1$: —$CH_3$ and $R^2$: —$CH_3$), the recurring unit (5) ($R^1$: —$CH_3$ and $R^2$: —$CH_3$), and the recurring unit of the formula (14) was 33.8:14.1:52.1 (mol %). This resin is referred to as a "resin (A-10)".

Synthesis Example 11

A homogeneous monomer solution was prepared by dissolving 38.23 g (35 mol %) of the compound (m), 15.51 g (15 mol) of the compound (c), 46.26 g (50 mol %) of the compound (c), and 5.80 g of dimethyl azobisisobutyrate in 300 g of 2-butanone, and processed in the same manner as in Synthesis Example 1 to obtain a white resin powder (77 g, yield 77 wt %).

This resin was a copolymer with a Mw of 6,500 in which the ratio of the recurring unit (5) ($R^1$: —$CH_3$ and $R^2$: —$CH_3$), the recurring unit (1) ($R^1$: —$CH_3$ and $R^2$: —$C_2H_5$), and the recurring unit of the formula (10) was 32.7:10.3:56.0 (mol %). This resin is referred to as a "resin (A-11)".

Synthesis Example 12

A homogeneous monomer solution was prepared by dissolving 39.38 g (35 mol %) of the compound (m), 15.98 g (15 mol) of the compound (g), 47.03 g (50 mol %) of the compound (l), and 5.92 g of dimethyl azobisisobutyrate in 300 g of 2-butanone, and processed in the same manner as in Synthesis Example 1 to obtain a white resin powder (76 g, yield 76 wt %).

This resin was a copolymer with a Mw of 5,900 in which the ratio of the recurring unit (5) ($R^1$: —$CH_3$ and $R^2$: —$CH_3$), the recurring unit (1) ($R^1$: —$CH_3$ and $R^2$: —$C_2H_5$), and the recurring unit of the formula (14) was 34.2:13.8:52.2 (mol %). This resin is referred to as a "resin (A-12)".

Synthesis Example 13

A homogeneous monomer solution was prepared by dissolving 35.64 g (35 mol %) of the compound (n), 16.25 g (15 mol) of the compound (j), 48.12 g (50 mol %) of the compound (l), and 6.38 g of dimethyl azobisisobutyrate in 300 g of 2-butanone, and processed in the same manner as in Synthesis Example 1 to obtain a white resin powder (76 g, yield 76 wt %).

This resin was a copolymer with a Mw of 6,900 in which the ratio of the recurring unit (5) ($R^1$: —H and $R^2$: —$CH_3$), the recurring unit (1) ($R^1$: —$CH_3$ and $R^2$: —$C_2H_5$), and the recurring unit of the formula (14) was 34.1:13.6:52.3 (mol %). This resin is referred to as a "resin (A-13)".

Synthesis Example 14

A homogeneous monomer solution was prepared by dissolving 42.40 g (40 mol %) of the compound (a), 12.37 g (15 mol) of a compound with $R^1$: —$CH_3$ and $R^2$: —$C_2H_5$ in the formula (2m) (compound (o)), 45.24 g (45mol %) of the compound (c), and 8.33 g of methyl azobisisobutyrate in 300 g of 2-butanone, and processed in the same manner as in Synthesis Example 1 to obtain a white resin powder (65 g, yield 65 wt %).

This resin was a copolymer with a Mw of 6,200 in which the ratio of the recurring unit (1) ($R^1$: —$CH_3$ and $R^2$: —$CH_3$), the recurring unit (2) ($R^1$: —$CH_3$ and $R^2$: —$C_2H_5$), and the recurring unit of the formula (10) was 37.6:13.4:49.0 (mol %). This resin is referred to as a "resin (A-14)".

Synthesis Example 15

A homogeneous monomer solution was prepared by dissolving 44.63 g (42 mol %) of the compound (a), 14.05 g (17 mol) of the compound (o), 41.32 g (41 mol %) of the compound (c), and 7.08 g of methyl azobisisobutyrate in 300 g of 2-butanone, and processed in the same manner as in Synthesis Example 1 to obtain a white resin powder (73 g, yield 73 wt %).

This resin was a copolymer with a Mw of 5,900 in which the ratio of the recurring unit (1) ($R^1$: —$CH_3$ and $R^2$: —$CH_3$), the recurring unit (2) ($R^1$: —$CH_3$ and $R^2$: —$C_2H_5$), and the recurring unit of the formula (10) was 39.2:17.1:43.8 (mol %). This resin is referred to as a "resin (A-15)".

Synthesis Example 16

A homogeneous monomer solution was prepared by dissolving 44.07 g (42 mol %) of the compound (a), 8.16 g (10 mol) of the compound (o), 47.77 g (48 mol %) of the compound (c), and 8.24 g of methyl azobisisobutyrate in 300 g of 2-butanone, and processed in the same manner as in Synthesis Example 1 to obtain a white resin powder (78 g, yield 78 wt %).

This resin was a copolymer with a Mw of 5,900 in which the ratio of the recurring unit (1) ($R^1$: —$CH_3$ and $R^2$: —$CH_3$), the recurring unit (2) ($R^1$: —$CH_3$ and $R^2$: —$C_2H_5$), and the recurring unit of the formula (10) was 38.7:10.4:50.9 (mol %). This resin is referred to as a "resin (A-16)".

Comparative Example 17 (for Comparison)

76 g (yield 76 wt %) of a white resin powder was prepared in the same manner as in Synthesis Example 1, except for using a monomer solution which was prepared by dissolving 41.28 g (40 mol %) of the compound (a), 58.72 g (60 mol %) of the compound (c), and 6.00 g of dimethyl azobisisobutyrate in 200 g of 2-butanone.

This resin was a copolymer with a Mw of 7,500 and a mol % ratio of the recurring unit (1) and the recurring unit of the formula (10) of 39.5:60.5 (mol %). This resin is referred to as a "resin (R-1)".

Examples 1–22 and Comparative Examples 1–2

The compositions containing the components shown in Tables 1 and 2 were evaluated. The evaluation results are shown in Tables 4 and 5. Components other than the resins (A-1) to (A-16) and the resin (R-1) shown in Tables 1 and 2 are as follows.

Acid Generator (B)
  B-1: 1-(4-n-butoxynaphthyl)tetrahydrothiophenium nonafluoro-n-butanesulfonate
  B-2: triphenylsulfonium nonafluoro-n-butanesulfonate
  B-3: 4-cyclohexylphenyl-diphenylsulfonium nonafluoro-n-butanesulfonate Acid diffusion controller (D)
  D-1: N-t-butoxycarbonyl-2-phenylbenzimidazole
  D-2: 3-pyperidino-1,2-propanediol
  D-3: N-t-butoxycarbonyl-4-hydroxypiperidine
  D-4: 2,6-diisopropylaniline Cyclic Compound (E)
  E-1: t-butoxycarbonylmethyl deoxycholate
  E-2: t-butoxycarbonylmethyl lithocholate
  E-3: 3-[2-hydroxy-2,2-bis(trifluoromethyl)ethyl]tetracyclo[4.4.0.1$^{2,5}$.1$^{7,10}$]dodecane Solvent (C)
  C-1: propylene glycol monomethyl ether acetate
  C-2: 2-heptanone
  D-3: cyclohexanone
  D-4: γ-butyrolactone

TABLE 1

| | Resin (part) | Acid generator (B) (part) | Acid diffusion controller (D) (part) | Alicyclic compound (E) (part) | Solvent (C) (part) |
|---|---|---|---|---|---|
| Example 1 | A-1(94) | B-1(5) | D-1(0.20) | E-1(6) | C-1(650) C-2(200) |
| Example 2 | A-2(94) | B-1(5) | D-1(0.20) | E-1(6) | C-1(650) C-2(200) |
| Example 3 | A-3(94) | B-1(5) | D-1(0.20) | E-1(6) | C-1(650) C-2(200) |
| Example 4 | A-4(94) | B-1(5) | D-1(0.20) | E-1(6) | C-1(650) C-2(200) |
| Example 5 | A-5(94) | B-2(2) B-3(1) | D-2(0.25) | E-1(6) | C-1(650) C-3(200) |
| Example 6 | A-6(94) | B-2(2) B-3(1) | D-2(0.25) | E-1(6) | C-1(650) C-3(200) |
| Example 7 | A-7(94) | B-2(2) B-3(1) | D-2(0.25) | E-1(6) | C-1(650) C-3(200) |
| Example 8 | A-8(94) | B-2(2) B-3(1) | D-2(0.25) | E-1(6) | C-1(650) C-3(200) |
| Example 9 | A-9(94) | B-2(2) B-3(1) | D-2(0.25) | E-1(6) | C-1(650) C-3(200) |
| Example 10 | A-10(94) | B-2(2) B-3(1) | D-2(0.25) | E-1(6) | C-1(650) C-3(200) |
| Example 11 | A-11(94) | B-2(2) B-3(1) | D-2(0.25) | E-1(6) | C-1(650) C-3(200) |
| Example 12 | A-12(94) | B-2(2) B-3(1) | D-2(0.25) | E-1(6) | C-1(650) C-3(200) |
| Example 13 | A-13(94) | B-2(2) B-3(1) | D-2(0.25) | E-1(6) | C-1(650) C-3(200) |
| Comparative Example 1 | R-1(94) | B-1(5) | D-1(0.20) | E-1(6) | C-1(450) C-2(200) |

TABLE 2

| | Resin (part) | Acid generator (B) (part) | Acid diffusion controller (D) (part) | Alicyclic compound (E) (part) | Solvent (C) (part) |
|---|---|---|---|---|---|
| Example 14 | A-14(94) | B-2(2) B-3(1) | D-2(0.25) | E-1(6) | C-1(750) C-3(350) |
| Example 15 | A-14(96) | B-1(3) B-2(2) | D-3(0.52) | E-2(4) | C-1(930) C-3(400) |
| Example 16 | A-14(96) | B-1(3) B-2(2) | D-3(0.52) | E-2(4) E-3(2) | C-1(930) C-3(400) |
| Example 17 | A-14(100) | B-2(3) | D-4(0.43) | E-3(2) | C-1(930) C-3(400) |
| Example 18 | A-14(100) | B-2(3) | D-4(0.43) | | C-1(1270) C-4(20) |
| Example 19 | A-15(96) | B-1(3) B-2(2) | D-3(0.52) | E-2(4) | C-1(930) C-3(400) |
| Example 20 | A-16(100) | B-1(4) | D-4(0.50) | E-3(2) | C-1(930) C-3(400) |
| Example 21 | A-6(94) | B-2(2) B-3(1) | D-2(0.25) | E-1(6) | C-1(750) C-3(350) |
| Example 22 | A-6(96) | B-1(3) B-2(2) | D-3(0.52) | E-2(4) | C-1(930) C-3(400) |
| Comparative Example 2 | R-1(96) | B-1(3) B-2(2) | D-3(0.52) | E-2(4) | C-1(930) C-3(400) |

TABLE 3

| | PB (°C.) | PB (seconds) | PEB (°C.) | PB (seconds) | Developing time (seconds) |
|---|---|---|---|---|---|
| Example 14 | 115 | 90 | 105 | 90 | 30 |
| Example 15 | 120 | 90 | 110 | 90 | 40 |
| Example 16 | 120 | 90 | 110 | 90 | 40 |
| Example 17 | 125 | 90 | 110 | 90 | 60 |
| Example 18 | 125 | 90 | 110 | 90 | 60 |
| Example 19 | 120 | 90 | 110 | 90 | 40 |
| Example 20 | 125 | 90 | 110 | 90 | 60 |
| Example 21 | 115 | 90 | 115 | 90 | 30 |
| Example 22 | 120 | 90 | 120 | 90 | 40 |
| Comparative Example 2 | 130 | 90 | 130 | 90 | 40 |

TABLE 4

| | Radiation transmittance (193 nm, %) | Sensitivity (J/m$^2$) | Resolution (µm) | Dryetching resistance | Pattern profile |
|---|---|---|---|---|---|
| Example 1 | 75 | 130 | 0.13 | 1.0 | Good |
| Example 2 | 73 | 135 | 0.13 | 0.9 | Good |
| Example 3 | 74 | 140 | 0.13 | 1.0 | Good |
| Example 4 | 75 | 128 | 0.13 | 1.0 | Good |
| Example 5 | 76 | 137 | 0.13 | 1.0 | Good |
| Example 6 | 75 | 130 | 0.13 | 1.0 | Good |
| Example 7 | 75 | 127 | 0.13 | 0.9 | Good |
| Example 8 | 76 | 125 | 0.13 | 1.0 | Good |
| Example 9 | 74 | 140 | 0.13 | 0.9 | Good |
| Example 10 | 76 | 144 | 0.13 | 0.9 | Good |
| Example 11 | 76 | 120 | 0.13 | 0.9 | Good |
| Example 12 | 76 | 122 | 0.13 | 0.9 | Good |
| Example 13 | 74 | 138 | 0.13 | 0.9 | Good |
| Comparative Example 1 | 75 | 180 | 0.14 | 1.0 | Bad |

TABLE 5

| | Sensitivity 2 (J/m$^2$) | Sensitivity 3 (J/m$^2$) | Crude density difference | Space DOF | PEB temperature dependency (nm/°C.) |
|---|---|---|---|---|---|
| Example 14 | 290 | 270 | Good | Good | 7.4 |
| Example 15 | 260 | 240 | Good | Good | 6.5 |
| Example 16 | 250 | 240 | Good | Good | 6.3 |
| Example 17 | 320 | 290 | Good | Good | 5.2 |
| Example 18 | 330 | 305 | Good | Good | 4.9 |
| Example 19 | 230 | 220 | Good | Good | 6.8 |
| Example 20 | 310 | 290 | Good | Good | 5.1 |

TABLE 5-continued

| | Sensitivity 2 (J/m$^2$) | Sensitivity 3 (J/m$^2$) | Crude density difference | Space DOF | PEB temperature dependency (nm/° C.) |
|---|---|---|---|---|---|
| Example 21 | 300 | 280 | Good | Good | 13.2 |
| Example 22 | 250 | 230 | Good | Good | 14.3 |
| Comparative Example 2 | 320 | 260 | Good | Bad | 17.3 |

The radiation-sensitive resin composition of the present invention is useful as a chemically amplified resist sensitive to active rays, particularly deep ultraviolet rays represented, for example, by a KrF excimer laser (wavelength 248 nm) or an ArF excimer laser (wavelength: 193 nm). The resin composition has high transparency to radiation and exhibits excellent properties as a resist such as high resolution, sensitivity, and dry etching resistivity, and pattern profile. The resist also exhibits well-balanced process margin and LER. If combined with a specific resin, acid generator, and solvent, the resin composition exhibits excellent properties, superior adhesion to substrates, and a good skirt configuration of patterns. The composition is very useful in the manufacture of integrated circuit elements of which downsizing is anticipated to proceed in the future.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:
(A) a resin comprising a copolymer consisting of methacrylate or acrylate recurring units, wherein the copolymer comprises at least two recurring units of the following formulas (1)–(6),

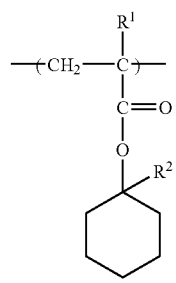

(1)

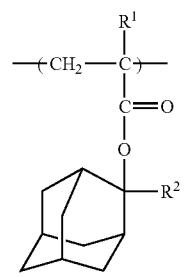

(2)

-continued

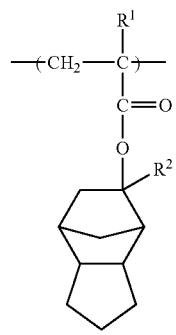

(3)

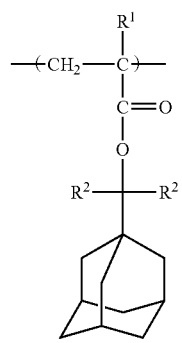

(4)

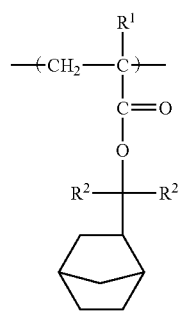

(5)

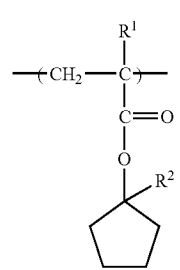

(6)

wherein $R^1$ represents a hydrogen atom or methyl group and $R^2$ represents a substituted or unsubstituted alkyl group having 1–4 carbon atoms, two or more $R^2$ groups that may be
- a first recurring unit of formula (5) and a second recurring unit of formula (5);
- a recurring unit of formula (5) and a recurring unit of formula (6); and
- a first recurring unit of formula (6) and a second recurring unit of formula (6).

2. The radiation-sensitive resin composition according to claim 1, wherein the photoacid generator (B) is compound shown by the formula (7),

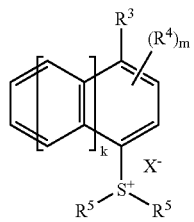
(7)

wherein $R^3$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, $R^4$ represents a linear or branched alkyl group having 1–10 carbon atoms, $R^5$ individually represents a linear or branched alkyl group having 1–10 carbon atoms, substituted or unsubstituted phenyl group, or substituted or unsubstituted naphthyl group, or two $R^5$ groups bond to form a substituted or unsubstituted divalent group having 2–10 carbon atoms, k is an integer of 0 to 2, $X^-$ represents an anion represented by the formula $R^6C_nF_{2n}SO_3^-$ (wherein $R^6$ represents a fluorine atom or substituted or unsubstituted monovalent hydrocarbon group and n is an integer of 1 to 10), and m is an integer of 0 to 10.

3. The radiation-sensitive resin composition according to claim 1, wherein the resin (A) and the photoacid generator (B) are dissolved in a solvent comprising at least one compound selected from the group consisting of propylene glycol mono-methyl ether acetate, 2-heptanone, and cyclohexanone.

4. A radiation-sensitive resin composition comprising,
(A) a resin comprising a copolymer consisting of methacrylate or acrylate recurring units, wherein the copolymer comprises a first recurring unit of the following formulas (1)–(3),

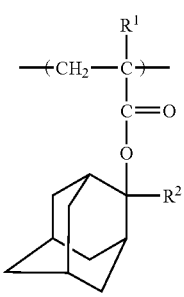
(1)

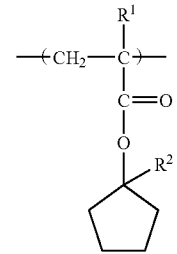
(2)

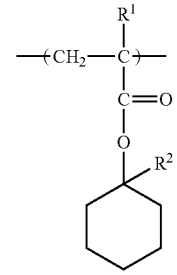
(3)

wherein $R^1$ represents a hydrogen atom or methyl group and $R^2$ is a methyl group, and a second recurring unit of the above formulas (1)–(3), wherein $R^1$ represents a hydrogen atom or methyl group and $R^2$ represents a substituted or unsubstituted alkyl group having 1–4 carbon atoms, excluding a methyl group, two or more $R^2$ groups that may be present being either the same or different, in the total amount of 5–70 mol %, but each in the amount of 1–49 mol %, the resin being insoluble or scarcely soluble in alkali, but becoming easily soluble in alkali by the action of an acid, and (B) a photoacid generator;
wherein the copolymer comprises a combination of recurring units selected from the group consisting of:
- a recurring unit of formula (1) and a recurring unit of formula (2);
- a recurring unit of formula (1) and a recurring unit of formula (3);
- a first recurring unit of formula (2) and a second recurring unit of formula (2);
- a recurring unit of formula (2) and a recurring unit of formula (3); and
- a first recurring unit of formula (3) and a second recurring unit of formula (3).

5. The radiation-sensitive resin composition according to claim 4, wherein the photoacid generator (B) is the compound shown by the formula (7),

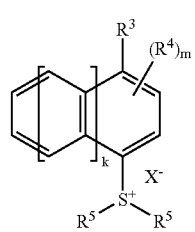
(7)

wherein $R^3$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, $R^4$ represents a linear or branched alkyl group having 1–10 carbon atoms, $R^5$ individually represents a linear or branched alkyl group having 1–10 carbon atoms, substituted or unsubstituted phenyl group, or substituted or unsubstituted naphthyl group, or two $R^5$ groups bond to form a substituted or unsubstituted divalent group having 2–10 carbon atoms, k is an integer of 0 to 2, $X^-$ represents an anion represented by the formula $R^6C_nF_{2n}SO_3^-$ (wherein $R^6$ represents a fluorine atom or substituted or unsubstituted monovalent hydrocarbon group and n is an integer of 1 to 10), and m is an integer of 0 to 10.

6. The radiation-sensitive resin composition according to claim 4, wherein the resin (A) and the photoacid generator (B) are dissolved in a solvent comprising at least one compound selected from the group consisting of propylene glycol mono-methyl ether acetate, 2-heptanone, and cyclohexanone.

7. A radiation-sensitive resin composition comprising, (A) a resin comprising at least one recurring unit of the following formula (6),

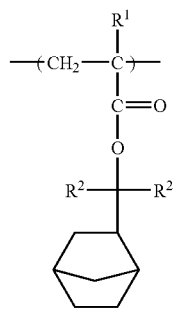

(6)

wherein $R^2$ is a methyl group, and at least one recurring unit selected from the group consisting of the recurring units of the formulas (1)–(3),

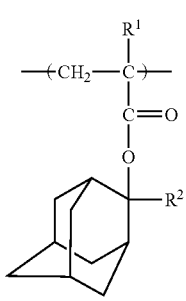

(1)

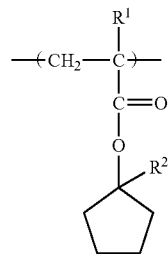

(2)

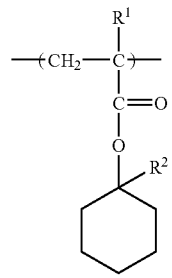

(3)

wherein $R^1$ represents a hydrogen atom or methyl group and $R^2$ is a methyl group, in the total amount of 5–70 mol %, but each in the amount of 1–49 mol %, the resin being insoluble or scarcely soluble in alkali, but becoming easily soluble in alkali by the action of an acid, and (B) a photoacid generator.

8. The radiation-sensitive resin composition according to claim 7, wherein the photoacid generator (B) is the compound shown by the formula (7),

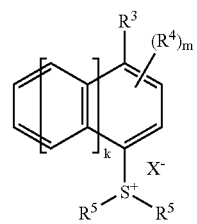

(7)

wherein $R^3$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, $R^4$ represents a linear or branched alkyl group having 1–10 carbon atoms, $R^5$ individually represents a linear or branched alkyl group having 1–10 carbon atoms, substituted or unsubstituted phenyl group, or substituted or unsubstituted naphthyl group, or two $R^5$ groups bond to form a substituted or unsubstituted divalent group having 2–10 carbon atoms, k is an integer of 0 to 2, $X^-$ represents an anion represented by the formula $R^6C_nF_{2n}SO_3^-$ (wherein $R^6$ represents a fluroine atom or substituted or unsubstituted monovalent hydrocarbon group and n is an integer of 1 to 10), and m is an integer of 0 to 10.

9. The radiation-sensitive resin composition according to claim 7, wherein the resin (A) and the photoacid generator (B) are dissolved in a solvent comprising at least one compound selected from the group consisting of propylene glycol mono-methyl ether acetate, 2-heptanone, and cyclohexanone.

10. A radiation-sensitive resin composition comprising:
(A) a resin comprising a first recurring unit of the following formulas (1)–(3),

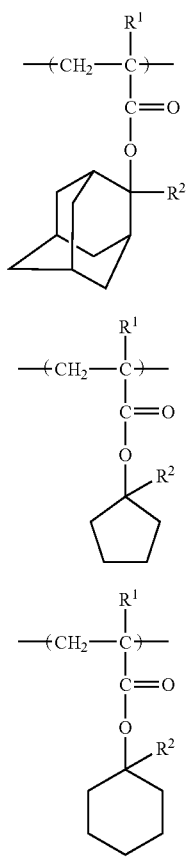

wherein $R^1$ represents a hydrogen atom or methyl group and $R^2$ is a methyl group, and a second recurring unit of the above formulas (1)–(3), wherein $R^1$ represents a hydrogen atom or methyl group and $R^2$ represents a substituted or unsubstituted alkyl group having 1–4 carbon atoms, excluding a methyl group, two or more $R^2$ groups that may be present being either the same or different, in the total amount of 5–70 mol %, but each in the amount of 1–49 mol %, the resin being insoluble or scarcely soluble in alkali, but becoming easily soluble in alkali by the action of an acid; and
(B) a photoacid generator;
wherein the resin further comprises the recurring unit shown by the following formula:

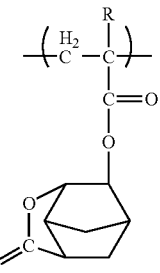

wherein R represents a hydrogen atom or a methyl group.

11. The radiation-sensitive resin composition according to claim 10, wherein the photoacid generator (B) is compound shown by the formula (7),

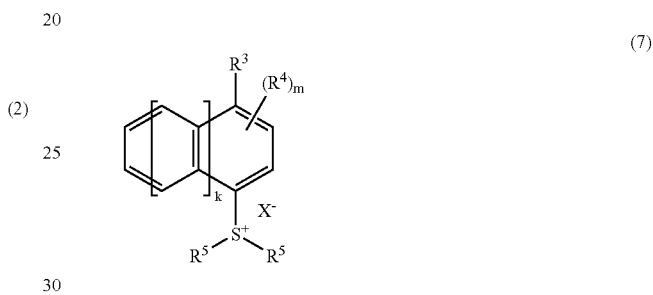

wherein:
$R^3$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms;
$R^4$ represents a linear or branched alkyl group having 1–10 carbon atoms;
$R^5$ individually represents a linear or branched alkyl group having 1–10 carbon atoms, substituted or unsubstituted phenyl group, or substituted or unsubstituted naphthyl group, or two $R^5$ groups bond to form a substituted or unsubstituted divalent group having 2–10 carbon atoms;
k is an integer of 0 to 2;
$X^-$ represents an anion represented by the formula $R^6C_nF_{2n}SO_3^-$ wherein $R^6$ represents a fluorine atom or substituted or unsubstituted monovalent hydrocarbon group and n is an integer of 1 to 10; and
m is an integer of 0 to 10.

12. The radiation-sensitive resin composition according to claim 10, wherein the resin (A) and the photoacid generator (B) are dissolved in a solvent comprising at least one compound selected from the group consisting of propylene glycol mono-methyl ether acetate, 2-heptanone, and cyclohexanone.

* * * * *